(12) United States Patent
Busemann et al.

(10) Patent No.: US 9,739,804 B2
(45) Date of Patent: Aug. 22, 2017

(54) CLOSURE FOR MEASURING VOLTAGE ON POWER-CARRYING CONDUCTORS

(71) Applicant: 3M INNOVATIVE PROPERTIES COMPANY, St. Paul, MN (US)

(72) Inventors: Friedrich A. Busemann, Amelinghausen (DE); Gerhard Lohmeier, Cologne (DE); Mark Gravermann, Erkelenz (DE)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/890,652

(22) PCT Filed: May 8, 2014

(86) PCT No.: PCT/US2014/037341
§ 371 (c)(1),
(2) Date: Nov. 12, 2015

(87) PCT Pub. No.: WO2014/189689
PCT Pub. Date: Nov. 27, 2014

(65) Prior Publication Data
US 2016/0084888 A1    Mar. 24, 2016

(30) Foreign Application Priority Data

May 24, 2013 (EP) .................................. 13169066

(51) Int. Cl.
*G01R 15/16* (2006.01)
*G01R 19/00* (2006.01)
(Continued)

(52) U.S. Cl.
CPC ......... *G01R 15/16* (2013.01); *G01R 19/0084* (2013.01); *H01F 38/30* (2013.01); *H02G 15/113* (2013.01)

(58) Field of Classification Search
CPC ....... H01F 38/30; H02G 15/113; G01R 15/16; G01R 15/26; G01R 15/142; G01R 15/144;
(Continued)

(56) References Cited

U.S. PATENT DOCUMENTS

| 4,090,130 A | * | 5/1978 | Willenbecher, Jr. .... F02P 17/12 324/126 |
| 4,795,973 A | * | 1/1989 | Smith-Vaniz .......... G01R 15/26 324/126 |

(Continued)

FOREIGN PATENT DOCUMENTS

| DE | 3702735 | 11/1988 |
| JP | 2005-158655 | 6/2005 |

(Continued)

OTHER PUBLICATIONS

International Search report for PCT International Application No. PCT/US2014/037341 mailed on Sep. 9, 2014, 3 pages.

*Primary Examiner* — Tung X Nguyen
*Assistant Examiner* — Lee Rodak
(74) *Attorney, Agent, or Firm* — Gregg H. Rosenblatt

(57) ABSTRACT

Closure (1) for receiving a section of a conductor assembly (71), comprising a housing (25) closable around the conductor assembly (71), and an electrode assembly (200), which comprises a movable portion comprising a contact surface (150) for mechanically contacting the conductor assembly (71), and a sensing electrode (140), operable as a first capacitor electrode of a sensing capacitor for sensing a voltage of the conductor (80). The closure further comprises urging means (160) for urging the movable portion of the electrode assembly (200) towards the conductor assembly (71) for establishing a mechanical surface contact between the contact surface (150) and the conductor assembly (71), (Continued)

Figure 1:
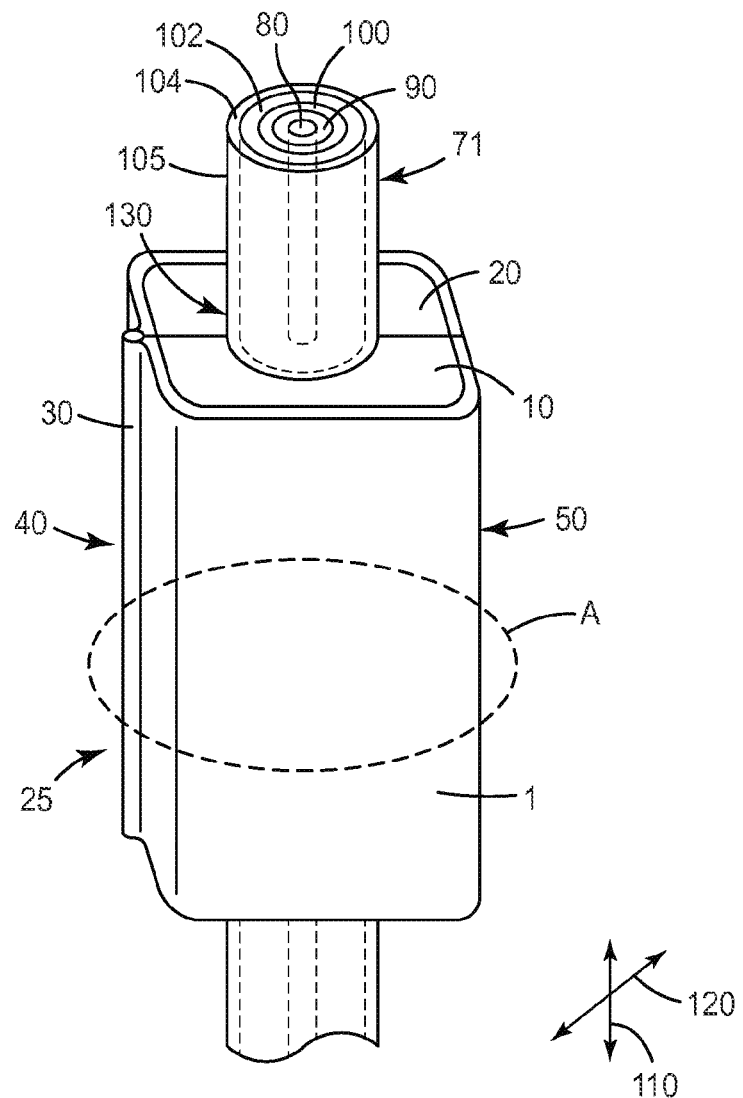

when the housing (25) is closed around the conductor assembly (71).

12 Claims, 8 Drawing Sheets

(51) Int. Cl.
*H02G 15/113* (2006.01)
*H01F 38/30* (2006.01)

(58) Field of Classification Search
CPC .... G01R 19/0046; G01R 19/0084; G01R 21/06; G01R 27/2605; G01R 31/312; G01R 1/22
USPC .................................................. 324/126, 127
See application file for complete search history.

(56) References Cited

U.S. PATENT DOCUMENTS

| | | | |
|---|---|---|---|
| 4,839,472 A | 6/1989 | Pichler | |
| 4,963,819 A | 10/1990 | Clarke | |
| 5,565,783 A * | 10/1996 | Lau | G01R 15/142 324/127 |
| 5,892,430 A * | 4/1999 | Wiesman | G01R 1/30 324/126 |
| 5,949,230 A * | 9/1999 | Kobayashi | G01R 1/07 324/544 |
| 7,265,533 B2 * | 9/2007 | Lightbody | G01R 15/142 324/126 |
| 2002/0167303 A1 * | 11/2002 | Nakano | G01R 31/312 324/126 |
| 2002/0171433 A1 | 11/2002 | Watanabe et al. | |
| 2007/0284131 A1 | 12/2007 | Dower | |
| 2012/0319675 A1 * | 12/2012 | El-Essawy | G01R 35/02 324/74 |
| 2012/0319676 A1 | 12/2012 | El-Essawy | |
| 2014/0120792 A1 | 5/2014 | Yoshida | |
| 2015/0346240 A1 * | 12/2015 | Gunn | G01R 35/005 324/127 |

FOREIGN PATENT DOCUMENTS

| | | |
|---|---|---|
| JP | 2006-100204 | 4/2006 |
| JP | 2009-004147 | 8/2009 |
| WO | WO 2009-139521 | 11/2009 |

\* cited by examiner

CLOSURE FOR MEASURING VOLTAGE ON POWER-CARRYING CONDUCTORS

The invention relates to closures that can be arranged around power-carrying conductor assemblies, for example around power cables of medium-voltage or high-voltage power networks.

Operators of electrical power networks monitor the state of their networks using sensors for measuring voltage on conductor assemblies, for example on power cables or bus bars, of their networks. Such conductor assemblies typically have a power-carrying inner conductor. In some conductor assemblies, e.g. cables, the inner conductor is surrounded by an insulating layer. The insulating layer may be surrounded by a shield layer and an outer cable sheath. In other assemblies, no insulating layer is present and the conductor is exposed, at least over a certain length of the conductor assembly.

For applying a voltage sensor, outer layers of a conductor assembly may need to be removed ("stripped") over a longitudinal, i.e. axial section of the assembly. In order to protect the stripped section, a closure can be applied over the stripped section.

For measuring the voltage of the inner conductor, some sensors use a capacitive sensing principle, in which the conductor forms a first capacitor electrode of a sensing capacitor, a conductive element of the sensor forms the second capacitor electrode, and an insulating layer, arranged between the first and the second electrodes, forms a dielectric of the sensing capacitor. The sensing capacitor thus formed is electrically connected in line with a further capacitor such that the two capacitors form a capacitive voltage divider, which provides a voltage signal indicative of the voltage of the conductor. Elements of a sensor can be arranged in a protective closure.

A specific type of voltage sensor is described in the German patent application DE 3702735 A1, in which the sensing capacitor consists of a part of the insulation of the conductor of a medium- or high-voltage cable.

A capacitive voltage sensor for an overhead power line is shown in the U.S. Pat. No. 4,963,819. The apparatus described in that disclosure has an inner electrode and solid electrical insulation material mounted on the inner electrode to provide the dielectric of the capacitor; an outer cylindrical electrode substantially coaxial with the inner electrode and mounted on a portion of the outer surface of the insulation material. The capacitor may be enclosed in an earthed housing.

Sensors for existing conductor assemblies should be fitted such that the insulating layer between the inner conductor and the secondary capacitor electrode comprises no voids or gaps, e.g. air bubbles or air pockets. Such voids can cause electrical partial discharges and eventually a failure of the sensor and of the conductor assembly. U.S. Pat. No. 4,963,819 suggests a conformable layer of conductive material between the high voltage conductor and the insulation material of the capacitor to minimize the occurrence of voids.

It is desirable to further reduce the risk of voids, in order to enhance the reliability of sensors and reduce the risk of failure of conductor assemblies comprising such sensors. It is further desirable to provide a sensor that can be used on conductor assemblies of different outer dimensions or cross sections.

The present disclosure seeks to address this problem. It provides a closure for receiving a section of a conductor assembly, the conductor assembly comprising a conductor which defines axial directions and radial directions, the closure comprising a housing closable around the conductor assembly, and a first electrode assembly, wherein the first electrode assembly comprises a) a movable portion which is movable relative to the housing, the movable portion comprising a contact surface for mechanically contacting the conductor assembly, and b) an electrically conductive first sensing electrode, operable as a first capacitor electrode of a sensing capacitor, which sensing capacitor comprises the conductor, or a conductor extension, as a second capacitor electrode and an electrically insulating layer, arranged between the conductor and the first sensing electrode when the housing is closed around the conductor assembly, as a dielectric, characterized in that the closure further comprises urging means, arranged between the housing and the first electrode assembly, the urging means being adapted to urge the movable portion of the first electrode assembly, relative to the housing, towards the conductor assembly for establishing a mechanical surface contact between the contact surface and an outer surface of the conductor assembly, when the housing is closed around the conductor assembly.

The closure according to the present disclosure reduces the risk of having voids or air pockets between the conductor assembly and the first electrode assembly by providing that the urging means can move the first electrode assembly relative to the housing and urge the first electrode assembly towards the conductor assembly. This keeps the electrode assembly in intimate mechanical contact with the conductor assembly, independent from mechanical tolerances in the size of the conductor assembly, of the electrode assembly, or of the housing, and independent of mechanical variations by thermal expansion, or of small deformations of the housing of the closure. The urging means urging the first electrode assembly towards the conductor assembly also permits the same closure to receive conductor assemblies of different outer dimensions or cross sections, and still reduce the risk of voids or air pockets.

The closure is suitable for receiving an axial section, i.e. a longitudinal portion, of the conductor assembly. The closure may thus comprise a receptacle or a bore for receiving a section of the conductor assembly. The closure according to the present disclosure may be adapted to be arranged around a section of the conductor assembly which is located at an end portion of the conductor assembly, e.g. at a cable end, or which is located at a middle portion of a conductor assembly, e.g. in a portion of a cable that is far from an end portion of the cable. In the latter case, it is advantageous if the housing comprises two or more shells that can be engaged with each other around the conductor assembly to close the closure.

Generally, the conductor of the conductor assembly defines axial directions and radial directions, perpendicular thereto. At each point of the conductor, axial directions are directions in which the conductor extends lengthwise, i.e. directions along the long direction or a central axis of the conductor. At each point of the conductor, radial directions are directions perpendicular to the axial directions in that point, e.g. radially outward from a center line of the conductor.

The conductor assembly may be a conductor assembly of a power network, like, for example, of a national grid. The conductor assembly may be a medium-voltage or a high-voltage conductor assembly.

The conductor may be a power-carrying conductor of the conductor assembly. The conductor may be a longitudinal conductor, i.e. a conductor extending lengthwise. An axial direction may then be defined by the direction in which the conductor extends lengthwise, while radial directions are perpendicular thereto.

An example of a medium-voltage or high-voltage conductor assembly of a power network, which comprises a longitudinal power-carrying conductor, is a medium-voltage or high-voltage power cable.

Generally, the conductor assembly may be a cable. It may be a medium-voltage or high-voltage power cable of a power network, i.e. it may be adapted to transport electrical energy from a power generator to households or to industry, for example. A medium- or high-voltage power cable is adapted to transport electrical energy over distances of more than ten meters and at current levels of more than 50 Ampere. A cable has a longitudinal power-carrying conductor for transporting electrical energy. It may have an insulating layer, arranged concentrically around the conductor. It may further have a conductive or semiconductive layer arranged on such an insulating layer. It may have a shielding layer and/or an insulating cable sheath. The cable sheath may form an outer surface, i.e. a radially outer surface, of the cable. A cable may be prepared, e.g. stripped, such that in a first axial section of the cable the outer surface of the cable is the outer surface of the insulating layer. A cable may be prepared, e.g. stripped, such that in a second axial section of the cable the outer surface of the cable is the outer surface of the conductive or semiconductive layer.

Alternatively, the conductor assembly may be a bus bar. It may be a medium-voltage or high-voltage bus bar of a power network. A bus bar may be adapted to transport electrical energy within installations of a power network at current levels of more than 50 Ampere. A bus bar has a longitudinal power-carrying conductor for transporting electrical energy. The conductor may be solid. An axial section of a bus bar and/or of the conductor may have a rectangular or a circular cross section. An axial section of the bus bar and/or of the conductor may be exposed, i.e. it may have no insulating layer and no sheath. In that case, an outer surface of the bus bar may be the outer surface of the conductor in that axial section.

The housing of the closure according to the present invention can be closed, i.e. it is closable. It may be closable around a conductor assembly. An axial section of the conductor assembly is thereby protected on all sides by the closure or the housing of the closure, when the housing is closed around the conductor assembly, except where the conductor assembly enters and exits the housing. The housing may be manually closable.

The housing of a closure according to the invention may be adapted to be re-closable. In other words, the housing may be adapted to be opened and thereafter closed again around the conductor assembly, after being closed around the conductor assembly. A housing that can be opened and closed again after being installed may allow for inspection of the interior of the closure and of the conductor assembly without having to replace the closure after the inspection.

The housing of the closure may comprise two, three, four or more shells that are engageable with each other for closing the housing around the conductor assembly. In other words, the shells can receive an axial section of the conductor assembly between them, so that an axial section of the conductor assembly is protected on all sides by the shells, when the housing is closed. For closing the housing, the shells or some of the shells may be engaged with each other. In certain embodiments, the housing of the closure comprises two shells that can be engaged with each other to form the housing. These two shells may then be called half-shells. A housing may comprise two half-shells that can be engaged with each other for closing the housing around the conductor assembly. In general, a housing comprising shells is advantageous in that it may allow a particularly easy access to the inside of the housing before the housing is closed by engaging the shells with each other. Generally, a closure housing comprising two or more engageable shells may be usable on uncut sections of a conductor assembly, because the housing can be closed around the conductor assembly by engaging shells with each other. In contrast, a one-piece housing, which has no shells, may only be usable close to an end of a cut cable, i.e. close to a cable end, because it needs to be pushed over the cable end.

A shell may have a hinge portion. When the housing is open, shells may be separate from each other, or they may be connected with each other at their respective hinge portions, for example by a hinge, e.g. by a living hinge. A shell may have a locking portion. Locking means, such as latches, catches, clips, lock bars, or bolts, may be arranged at the locking portion. For closing the housing, shells may be engaged with each other at their locking portions by engaging locking means of one shell with corresponding locking means of another shell.

The housing of a closure according to the present invention may be made from polymeric material. The polymeric material may comprise, for example, a polycarbonate, a polyethylene, an acrylo nitrile butadiene styrene ("ABS"), or a polypropylene. The housing of the closure may be electrically conductive or electrically insulating. An electrically non-conductive, insulating housing may be advantageous for use on bus bars, as it helps to avoid discharges between the bus bar and the housing. A conductive housing may be advantageous for electromagnetic shielding. Also, a conductive housing may be electrically grounded, so that it is safe to touch.

In general, a closure according to the present invention may comprise an electrically conductive shielding element, e.g. an electrically conductive shielding layer, adapted to envelope the first sensing electrode and at least a part of the conductor, when the housing is closed around the conductor assembly, for providing electromagnetic shielding between the first sensing electrode and an outside of the closure or of the shielding element. When the closure is open, the shielding element may not envelope the first sensing electrode and at least a part of the conductor. The shielding element may be electrically grounded. Generally, a shielding element may protect the first sensing electrode and potentially a second sensing electrode against some influence of electromagnetic fields outside an envelope formed by the shielding element or outside of the closure. This may enhance the accuracy of the voltage sensing via the first sensing electrode.

The housing of a closure according to this disclosure may be shaped such as to form one, two or more skirts, for reducing creepage current over an outer surface of the housing, when the housing is closed around the conductor assembly. Creepage current may, for example, flow between the conductor and an element of the closure on electrical earth potential. The skirts may be formed by an outer surface of the housing or may be separately formed and fitted over the housing. A skirt or skirts may reduce stray current and thus make the closure more suitable for high-voltage applications. A skirt or skirts may make the closure suitable for being used next to an end of the conductor assembly, e.g. next to an end of an insulated cable, and/or in conjunction with a cable termination or a cable plug. A closure according to the present disclosure may be a cable termination. Such a closure may have a skirt, a plurality of skirts or no skirts at all.

Generally, the first electrode assembly of a closure according to the present invention may be arranged inside the housing, when the housing is closed. Alternatively, it may be arranged outside the housing, when the housing is closed. An arrangement inside the housing has the advantage that the housing may protect the first electrode assembly against environmental influence.

The first electrode assembly of a closure according to the present invention comprises a movable portion, which is movable relative to the housing. At least a part of the movable portion of the first electrode assembly may be conformable around the conductor assembly. In the context of this disclosure, a conformable part is meant to be a part that is in mechanical contact with a hard conductor assembly at a first area of its surface, when the part is urged towards the conductor assembly with a low force, and at a second area of its surface, when the part is urged towards the conductor assembly with a high force, the second area comprising the first area and being considerably greater than the first area. A high force may be a force exerted by the urging means on the first electrode assembly. Generally, at least a part of the movable portion of the first electrode assembly, which part comprises the contact surface, may be conformable around the conductor assembly. A movable portion which is conformable may provide a better, i.e. more intimate, surface contact between the contact surface of the movable portion and the conductor assembly.

In certain embodiments, the first electrode assembly may consist of the first sensing electrode. This means that the first sensing electrode is the only component of the first electrode assembly. Such embodiments of the closure may be particularly useful for receiving a section of an insulated conductor assembly, e.g. of an insulated cable. The movable portion of the first electrode assembly may then be a movable portion of the first sensing electrode. The contact surface of the movable portion may then be an exposed surface of the first sensing electrode. The conformable part may be a part of the first sensing electrode or the entire first sensing electrode. The first sensing electrode may, for example, comprise a metalized foil or a metal foil, which may be conformable by virtue of being thin. When urged against the outer surface of a conductor assembly by the urging means, the foil may contact the conductor assembly at a larger area, so that a mechanical surface contact is established between the first electrode assembly and the conductor assembly. Another example of a conformable part of the movable portion of the first sensing electrode is a piece of electrically conductive mastic or a layer of electrically conductive silicone. Such materials may be soft and conformable at temperatures at which the closure is typically used, e.g. at outdoor temperature, so that they may conform around the conductor assembly such as to provide a good surface contact between the first sensing electrode and the conductor assembly when the urging means urges the first electrode assembly towards the conductor assembly. Generally, a conformable portion of the first electrode assembly may provide for a better, i.e. more intimate and/or larger surface contact between the first electrode assembly and the conductor assembly. A better surface contact further reduces the risk of air pockets forming between the first electrode assembly and the conductor assembly, which further reduces the risk of partial discharges and damage.

Also in the case of the conductor assembly comprising a bare, exposed conductor, and of the closure comprising the insulating layer operable as the dielectric, it may be advantageous to have a part of the movable portion of the first electrode assembly being conformable around the conductor, as this may provide for a better surface contact and thereby reduce the risk of air pockets and of partial discharges. Certain closures according to the present disclosure may thus have a first electrode assembly comprising an insulating layer which comprises the contact surface. In such closures, the insulating layer may have a portion which is conformable around the conductor assembly. In particular, this conformable portion may be a portion which comprises the contact surface of the first electrode assembly. Such a conformable portion of the insulating layer may, for example, comprise electrically insulating mastic, electrically insulating foam, or electrically insulating silicone.

A closure according to the present disclosure comprises urging means, which is/are arranged between the housing and the first electrode assembly. The urging means may be arranged inside the housing, when the housing is closed around the conductor assembly. The urging means may be adapted to urge the movable portion of the first electrode assembly, or the entire first electrode assembly, towards the conductor assembly, when the housing is closed, so that a mechanical surface contact can be established between the first electrode assembly and the conductor assembly.

The urging means may be actuatable from outside the closure, e.g. by turning a threaded element. The urging means may be actuatable after closing the housing of the closure, such that before actuating the urging means, the movable portion of the first electrode assembly is not urged towards the conductor assembly, and such that after actuating the urging means, the movable portion of the first electrode assembly is urged, relative to the housing, towards the conductor assembly for establishing the mechanical surface contact. Alternatively, or in addition, the urging means may be resilient or comprise a resilient material, a foam, a gel, a resilient mechanical element or a spring. A resilient urging means or an urging means comprising a resilient element is advantageous because it may be actuatable by closing the housing around the conductor assembly. In closures having such urging means, the urging means may be compressed by closing the housing. Due to the resilience, the urging means tends to regain its uncompressed shape, and thereby may urge the movable portion of the first electrode assembly towards the conductor assembly.

In certain embodiments, the urging means is a foam or a piece of foam. Such foam may comprise a polyurethane or a polyethylene, for example. Foam may provide resilience and resistance against environmental impacts while having a low density and thus being light-weight. Also, foam may be a cost-effective urging means. The foam may extend such as to fill the volume between the rear surface of the first electrode assembly, i.e. the surface facing away from the contact surface, and the housing. The foam may be a single homogenous piece of foam, or alternatively it may comprise a plurality of layers or portions. The layers or portions may have different mechanical and/or electrical properties. The foam is electrically non-conductive such as not to interfere with the first sensing electrode and the capacitive sensing of the voltage of the conductor. Generally, and for the same reason, the urging means may be electrically non-conductive or electrically insulating.

The urging means may be attached to the first electrode assembly, or it may be separate from the first electrode assembly. If the first electrode assembly comprises the insulating layer which is operable as a dielectric of the sensing capacitor, the urging means may be attached to the first sensing electrode, or it may be separate from the first sensing electrode.

Generally, the first sensing electrode may be thin and have two opposed major surfaces. A thin sensing electrode extends mainly in two dimensions, its extension in the third dimension is considerably smaller than its extension in said two dimensions, and the major surfaces extend in the two directions. A thin sensing electrode may comprise a shape that is curved in one direction, in two directions, or that is irregularly curved. The urging means may be arranged on or next to the major surface of the first sensing electrode which faces away from the contact surface. If the first electrode assembly comprises the insulating layer which is operable as a dielectric of the sensing capacitor, the insulating layer may be arranged on the major surface of the first sensing electrode which faces the contact surface, and the urging means may be arranged on the opposite major surface. The insulating layer and the urging means may be integrally formed as one piece, they may be separate pieces attached to each other, e.g. adhesively, or they may be separate pieces not attached to each other. Each of these options may be advantageous for cost-effective manufacturing and/or assembly of the closure, depending on the circumstances.

Generally, the first sensing electrode is operable as a first capacitor electrode of a sensing capacitor. The sensing capacitor may be suitable for sensing a voltage of the conductor, e.g. relative to ground or relative to another electrical potential. The sensing capacitor may comprise the conductor, or a conductor extension, as a second capacitor electrode. It may comprise an electrically insulating layer, arranged between the conductor and the first sensing electrode, or generally between the first and second capacitor electrodes, as a dielectric.

The sensing capacitor may be a first dividing capacitor in a capacitive voltage dividing sensor for sensing a voltage of the conductor. The capacitive voltage dividing sensor may comprise a second dividing capacitor. The second dividing capacitor may be electrically connected in series with the first dividing capacitor on one side, and with electrical ground on the other side. A voltage picked up between the first and the second dividing capacitor may be indicative of the voltage of the conductor relative to ground.

Certain embodiments of the closure according to the present disclosure may be particularly suitable for use with insulated conductor assemblies, i.e. for conductor assemblies, in which an electrically insulating layer is arranged around the conductor. The electrically insulating layer may be a solid layer. The electrically insulating layer may be arranged concentrically around the conductor. It may be arranged directly on the conductor or on an outer surface of the conductor.

An example of such an insulated conductor assembly is an insulated high-voltage or medium-voltage power cable. The sensing capacitor for sensing the voltage of the conductor may comprise, in this case, the first sensing electrode as its first capacitor electrode, the cable conductor as the second capacitor electrode, and the electrically insulating layer of the cable as a dielectric. The electrically insulating layer may be arranged between the conductor and the first sensing electrode. The electrically insulating layer may be arranged between the conductor and the first sensing electrode, when the housing is closed around the conductor assembly. The first sensing electrode, in some of these certain embodiments, may comprise the movable portion of the first electrode assembly and the contact surface of the first electrode assembly. The first electrode assembly may consist of the first sensing electrode. The first sensing electrode may thus be the first electrode assembly. A portion of the first sensing electrode may be the movable portion of the first electrode assembly. A surface, e.g. an exposed surface, of the first sensing electrode may be the contact surface of the first electrode assembly. The first sensing electrode may mechanically contact the insulating layer of the conductor assembly, when the housing is closed around the conductor assembly.

As explained above, the first sensing electrode may comprise the movable portion and the contact surface of the first electrode assembly, so that the first sensing electrode is operable as a first capacitor electrode of a sensing capacitor for sensing a voltage of the conductor, which sensing capacitor comprises the conductor, or a conductor extension, as a second capacitor electrode and an electrically insulating layer of the conductor assembly, arranged between the conductor and the first sensing electrode, as a dielectric. Such a closure is particularly advantageous because it requires a minimum of stripping work on the conductor assembly, e.g. on the insulated cable. The cable needs to be stripped down only so far as to expose the insulating layer. This may reduce the risk of damaging elements of the cable, and may minimize the amount of manual work in preparing the cable. Such a closure may also be easier to calibrate for voltage sensing, because the electric and mechanical properties of the cable insulation may be particularly well known. The sensing capacitor may comprise a conductor extension as a second capacitor electrode. A conductor extension may be an element that is in mechanical and electrical contact with the conductor. The sensing capacitor may comprise an electrically insulating layer of the conductor assembly, arranged between the conductor extension and the first sensing electrode, when the housing is closed, as a dielectric.

In certain embodiments, the conductor assembly may comprise an electrically insulating layer arranged around the conductor, as described above, which is operable as a dielectric of the sensing capacitor. In some of these embodiments, the conductor assembly may further comprise a conductive or semiconductive layer, arranged on the insulating layer. The conductive or semiconductive layer may be a solid layer. The conductive or semiconductive layer may be arranged concentrically around the insulating layer. It may be arranged directly on the insulating layer or on an outer surface of the insulating layer. An example of such an insulated conductor assembly is an insulated high-voltage or medium-voltage power cable, which has a conductive or semiconductive layer on the outside of its insulating layer.

Such a conductor assembly may be prepared, e.g. stripped, such that it comprises a first axial section in which the outer surface of the conductor assembly is the outer surface of the insulating layer. It may be further prepared such that it comprises a second axial section in which the outer surface of the conductor assembly is the outer surface of the conductive or semiconductive layer.

Certain closures according to the present disclosure may be particularly suitable for use with such conductor assemblies. In certain embodiments, a closure according to the disclosure may comprise an electrically conductive first auxiliary electrode, electrically insulated from the first sensing electrode, and arranged inside the housing in axially spaced relation to the first sensing electrode, such that the first auxiliary electrode can mechanically and electrically contact the second axial section, when the housing is closed around the conductor assembly such that the contact surface of the first electrode assembly mechanically contacts the first axial section. In these embodiments, the first sensing electrode may thus be in mechanical contact with the insulating layer of the conductor assembly, and the first auxiliary electrode may be in mechanical and electrical contact with the conductive or semiconductive layer of the conductor assembly, when the housing is closed around the conductor assembly in such a way that the contact surface of the first electrode assembly mechanically contacts the first axial section. The auxiliary electrode may thereby form a continuation of the conductive or semiconductive layer of the conductor assembly. The first auxiliary electrode may keep the electrical field between the first auxiliary electrode and the conductor more homogenous, in the second axial section. This reduces the risk of partial discharges between the conductor and other elements of the conductor assembly or of the closure. The first auxiliary electrode may be held on the same electrical potential as the conductive or semiconductive layer of the conductor assembly, e.g. at electrical ground. The first auxiliary electrode may be arranged on one side of the first sensing electrode. It may be axially separated from the first sensing electrode by a first gap.

In order to further reduce the risk of partial discharges between the conductor and other elements of the conductor assembly or of the closure, a conductor assembly may be prepared, e.g. stripped, such that it comprises a third axial section in which the outer surface of the conductor assembly is the outer surface of the conductive or semiconductive layer. The second axial section and the third axial section may be arranged on opposite axial sides of the first axial section. A closure according to the disclosure, usable with this conductor assembly, may further comprise an electrically conductive second auxiliary electrode, electrically insulated from the first sensing electrode, and arranged inside the housing in axially spaced relation to the first sensing electrode, such that the second auxiliary electrode can mechanically and electrically contact the third axial section, when the housing is closed around the conductor assembly such, that the contact surface of the first electrode assembly mechanically contacts the first axial section. In these embodiments, the first sensing electrode may thus be in mechanical contact with the insulating layer of the conductor assembly, the first auxiliary electrode may be in mechanical and electrical contact with the conductive or semiconductive layer of the conductor assembly in the second axial section, and the second auxiliary electrode may be in mechanical and electrical contact with the conductive or semiconductive layer of the conductor assembly in the third axial section when the housing is closed around the conductor assembly such, that the contact surface of the first electrode assembly mechanically contacts the first axial section. The second auxiliary electrode brings the same advantages as the first auxiliary electrode, additionally in the third axial section of the conductor assembly. The second auxiliary electrode may be held on the same electrical potential as the conductive or semiconductive layer of the conductor assembly, e.g. at electrical ground. The second auxiliary electrode may be arranged on an axial side of the first sensing electrode, opposite to the side on which the first auxiliary electrode is arranged. It may be separated from the first sensing electrode by a second gap.

The first auxiliary electrode and the second auxiliary electrode may be electrically connected with each other. They may be connected via an electrically conductive portion of the housing, and/or via a wire, and/or via a contact or an element on a circuit board.

The first sensing electrode may be thin. It may be essentially flat and lie in a first plane, when the housing is not closed around the conductor assembly. The first auxiliary electrode and/or the second auxiliary electrode may be thin. They may be essentially flat and may lie in a second plane, when the housing is not closed around the conductor assembly. The first plane and the second plane may be parallel to each other or they may be identical.

Certain conductor assemblies may have a bare, exposed conductor. An example of such a conductor assembly is a bus bar. At least in an axial section, such a conductor assembly comprises no insulating layer around the conductor, which insulating layer would be operable as a dielectric of a sensing capacitor, in which the conductor is operable as a first capacitor electrode. In such conductor assemblies, or in a section of such conductor assemblies, the outer surface of the conductor assembly is an outer surface of the conductor. For capacitive voltage sensing of a voltage of the conductor, certain closures according to the present disclosure may provide an insulating layer that is operable as the dielectric. The first electrode assembly of such closures may thus further comprise an electrically insulating layer, arranged between the first sensing electrode and the contact surface, such that the insulating layer is operable as the dielectric of the sensing capacitor, when the housing is closed around the conductor assembly, wherein the insulating layer comprises the contact surface. Such a closure allows for voltage sensing on bare or exposed conductors. Also, the insulating layer is comprised in the closure, so that the mechanical and electrical properties of the insulating layer may be adjustable such as to be compatible with other elements of the closure. A closure having a built-in insulating layer may be easier to install, because no separate insulating element needs to be handled and positioned during installation of the closure on a conductor assembly.

The insulating layer comprised in the first electrode assembly may be solid or liquid. It may comprise a gel. It may, for example, be, or comprise, a polymeric material. It may, for example, be a polymeric foam or comprise a polymeric foam. Such polymeric foam may comprise silicone, EPDM (Ethylene Propylene Diene Monomer) or EPR (Ethylene Propylene Rubber). The insulating layer may be resilient or comprise a resilient portion. Alternatively, the insulating layer may be rigid or comprise a rigid portion. A rigid insulating layer or a rigid portion of the insulating layer may be suitable for maintaining a fixed distance between the first sensing electrode and the conductor, when the housing is closed around the conductor assembly. A fixed distance may provide for a more constant capacitance of the sensing capacitor, of which the insulating layer forms the dielectric, and hence for a greater sensing accuracy.

The insulating layer may be attached to the first sensing electrode, e.g. adhesively, or it may be separate from the first sensing electrode. The insulating layer may be attached to the urging means, e.g. adhesively. It may be integrally formed in one piece with the urging means, or it may be separate from the urging means. The insulating layer, the first sensing electrode and the urging means may be attached to each other such as to form a single element that can be removed in one from the housing. A single element may facilitate the assembly of the closure. An exposed surface of the insulating layer may be the contact surface of the first electrode assembly for mechanically contacting the conductor assembly. In other words, the insulating layer may comprise the contact surface. The insulating layer may comprise a plurality of portions, e.g. a plurality of layers, of different mechanical or electrical properties, so that the insulating layer can be adjusted to be usable with different kinds of conductor assemblies and/or different kinds of sensing electrodes. The contact surface of the insulating layer may be adapted for contacting specific kinds of outer surfaces of the conductor assembly. It may, for example, be roughened or polished.

Generally, a closure according to the present disclosure may further comprise
a) a second electrode assembly, which is arranged inside the housing, and which comprises an electrically conductive second sensing electrode, and
b) an electrically conductive element for electrically connecting the second sensing electrode and the first sensing electrode with each other.

The second electrode assembly may be arranged such that the conductor assembly is sandwiched between the first electrode assembly and the second electrode assembly when the housing is closed around the conductor assembly. In other words, the first and second electrode assemblies may be arranged in the closure such that they are located on opposite sides of the conductor assembly when the housing is closed around the conductor assembly. The first and the second sensing electrodes may each comprise a flat portion, lying in respective first and second geometric planes. When the housing is closed around a conductor assembly, the flat portions may be arranged such that the first and second planes are parallel to each other. The flat portions may be arranged such that, when the housing is closed around a conductor assembly, the flat portions in direct mechanical and electrical contact with each other. A closure comprising a first and a second electrode assembly may further comprise an electrically conductive element for electrically connecting the second sensing electrode and the first sensing electrode with each other. The electrically conductive element may be a wire or a piece of conductive silicone. It may be arranged inside or outside the closure, when the housing is closed. If arranged outside, it may be arranged on the outer surface of the housing.

A second electrode assembly comprising a second sensing electrode may be usable as an additional or as an alternative first capacitor electrode of the sensing capacitor, which comprises the conductor as a second capacitor electrode and the insulating layer as a dielectric. A further insulating layer may be arranged between the conductor and the second sensing electrode. The further insulating layer may be comprised in the closure or in the conductor assembly. The second sensing electrode may also be usable as a backup first capacitor electrode in case of a failure of the first sensing electrode, thereby enhancing the reliability of the closure. If the first and the second sensing electrodes are electrically connected with each other, they may be used in conjunction, their combination forming the first capacitor electrode of the sensing capacitor.

This may result in a higher output signal and/or a higher signal-to-noise ratio, and thereby increase the accuracy of sensing the voltage of the conductor. In a closure, in which the first and the second sensing electrodes are not in mechanical contact with each other when the housing is closed around the conductor assembly, the electrically conductive element may be a cost-effective means to electrically connect the first and the second sensing electrodes with each other. If the first and the second sensing electrodes are not electrically connected with each other, the second sensing electrode may be used for energy harvesting, i.e. for picking up small amounts electrical energy from the conductor assembly. This electrical energy can, for example, be used to power electric or electronic components that can transmit signals representing the voltage of the conductor.

A closure according to the present disclosure may comprise a circuit board having an electrical sensor contact, the sensor contact being electrically connected with the first sensing electrode. The sensor contact may, for example, be a solder point or a solder contact on the circuit board. Such a circuit board may be a cost-effective and versatile means to electrically connect the first sensing electrode with other electrical components, e.g. with a second sensing electrode, or with a capacitor which is operable as a second dividing capacitor in a capacitive voltage divider, which comprises the sensing capacitor, formed by the first sensing electrode and the conductor, as a first dividing capacitor. The capacitive voltage divider may be operable to sense a voltage of the conductor. The circuit board may be adapted to support electric or electronic components, and/or to establish an electrical contact between the sensor contact and one or more of the electric or electronic components. The circuit board may be rigid or flexible.

The circuit board may also support, i.e. provide a platform for, electric or electronic components which may be operable to sense a voltage of the conductor, to process an electrical signal or to transmit a signal containing information related to the sensed voltage. The circuit board may be arranged inside the closure, when the housing is closed. This arrangement keeps electrical paths short and may increase sensing accuracy. It also provides mechanical and/or environmental protection for the circuit board. Alternatively, the circuit board may be arranged outside the housing. This arrangement allows for easy access to the circuit board, independent of the housing being closed or open, thereby facilitating connection of further electrical or electronic components to the circuit board and/or to the first sensing electrode via the circuit board. The circuit board may be arranged outside the housing and on an exterior surface of the housing. This latter arrangement may help to keep electrical paths between the first sensing electrode and the circuit board short, and thereby increase sensing accuracy, while providing easy access to the circuit board, when the closure is closed.

The present invention also provides a conductor assembly, a power cable or a bus bar for a power network, comprising a power-carrying conductor, and any one of the closures described above. The present disclosure further provides a high-voltage or medium-voltage power network, comprising such a conductor assembly, such a power cable or such a bus bar.

The invention will now be described in more detail with reference to the following Figures exemplifying particular embodiments of the invention. Various embodiments of the present invention are described and shown in the Figures, wherein like elements are provided with the same reference numbers. Elements in the Figures may not be drawn to scale, and some dimensions may be exaggerated for greater clarity.

Figure 2A:
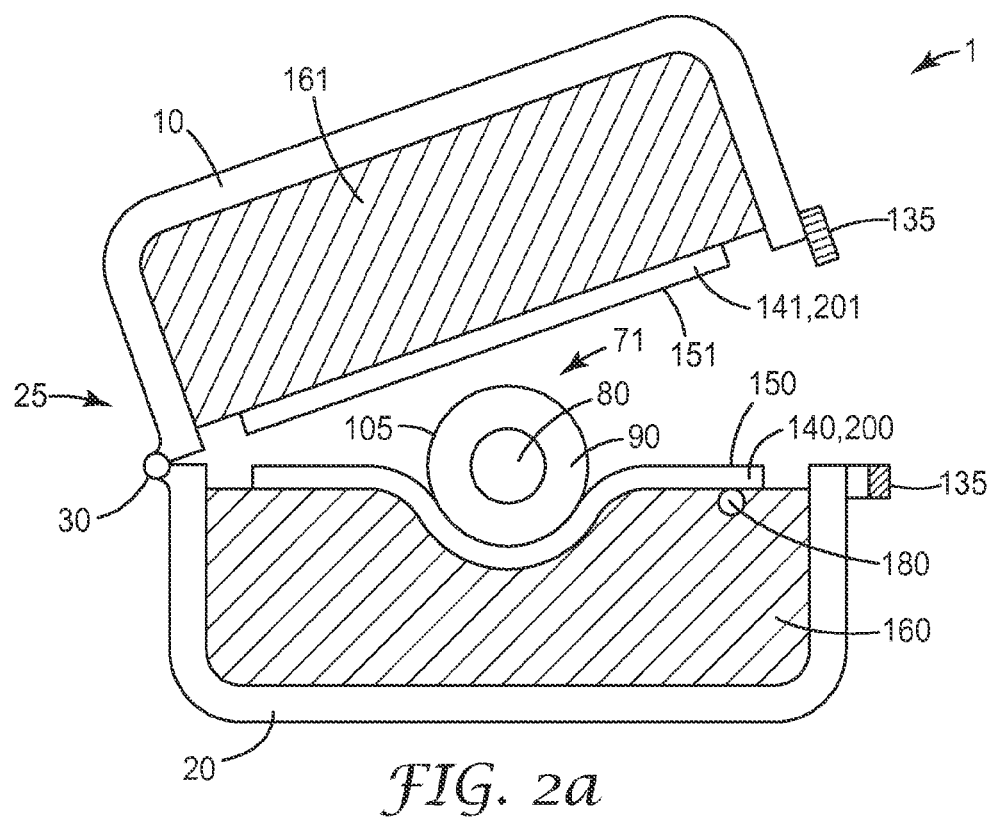
Figure 2B:
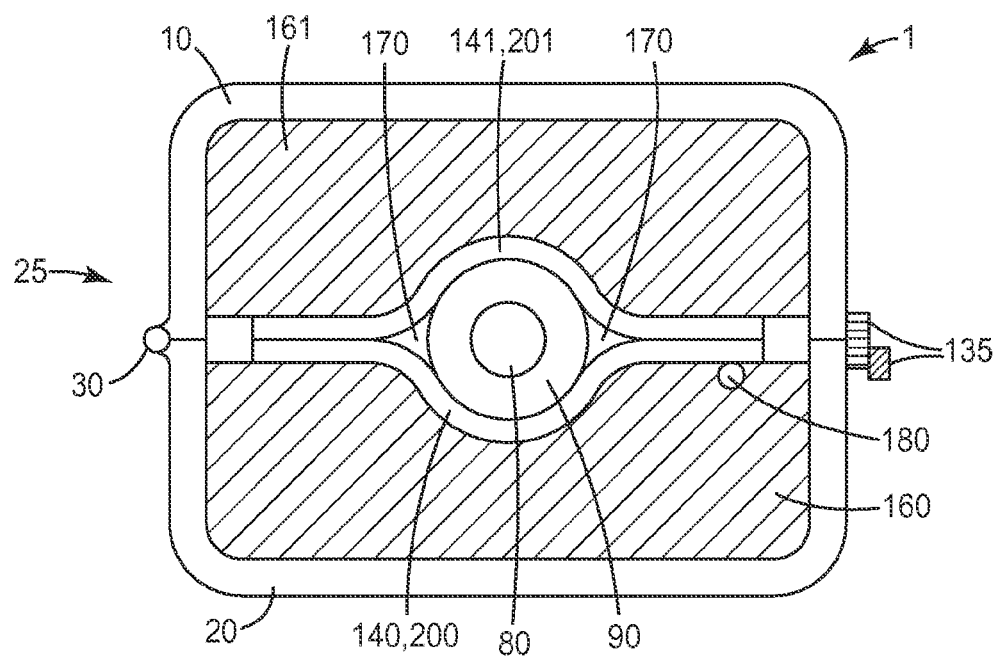
Figure 3:
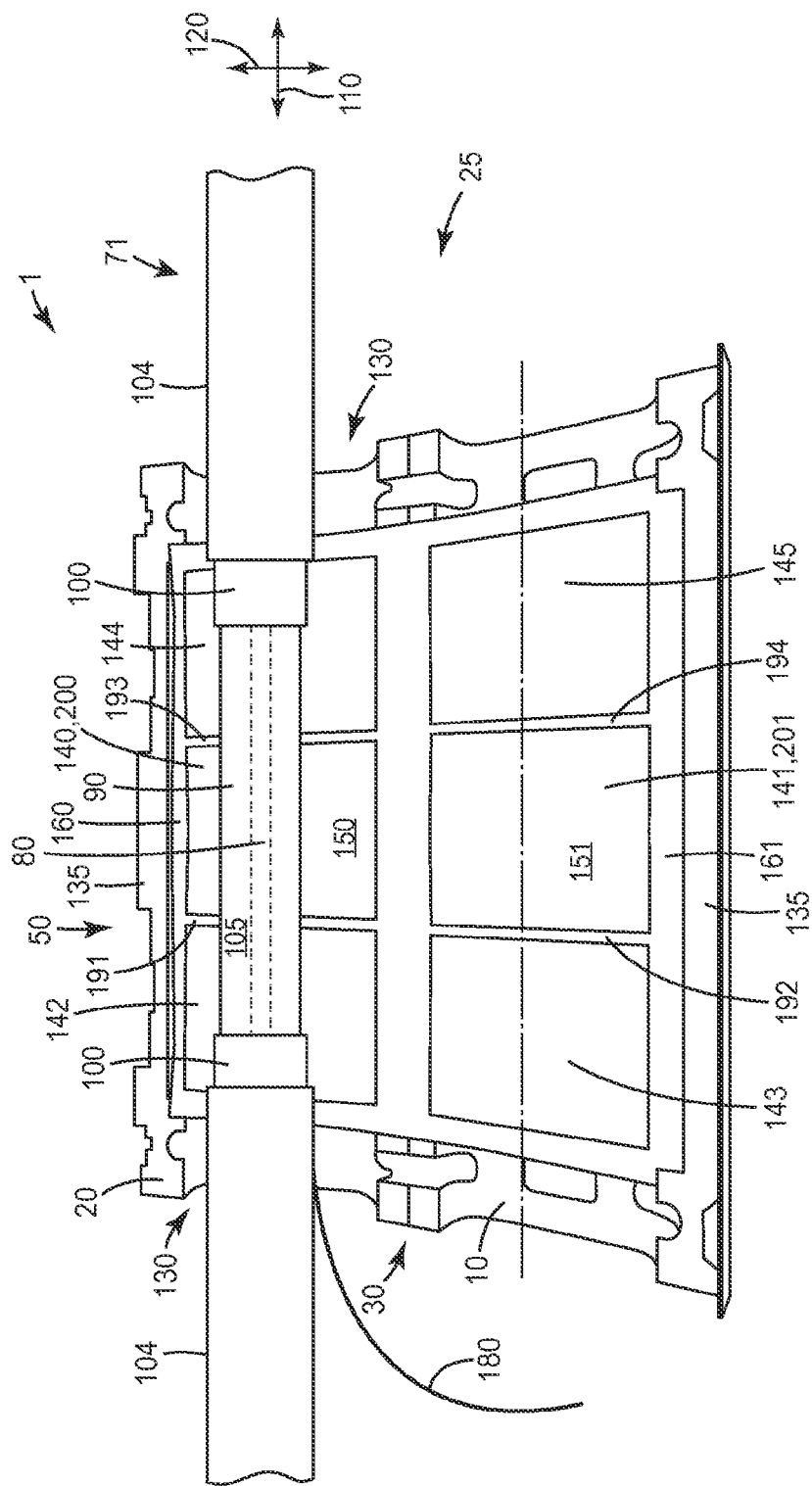
Figure 4:
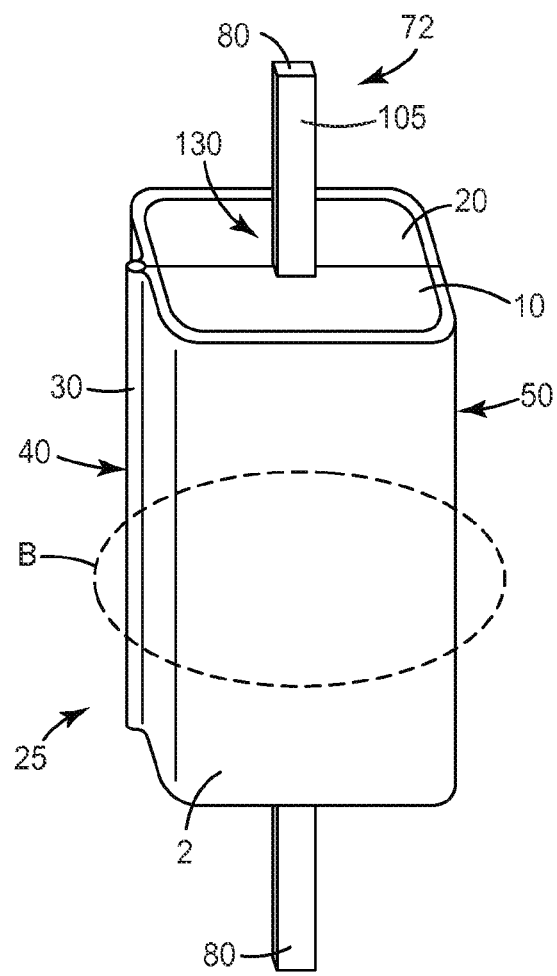
Figure 5A:
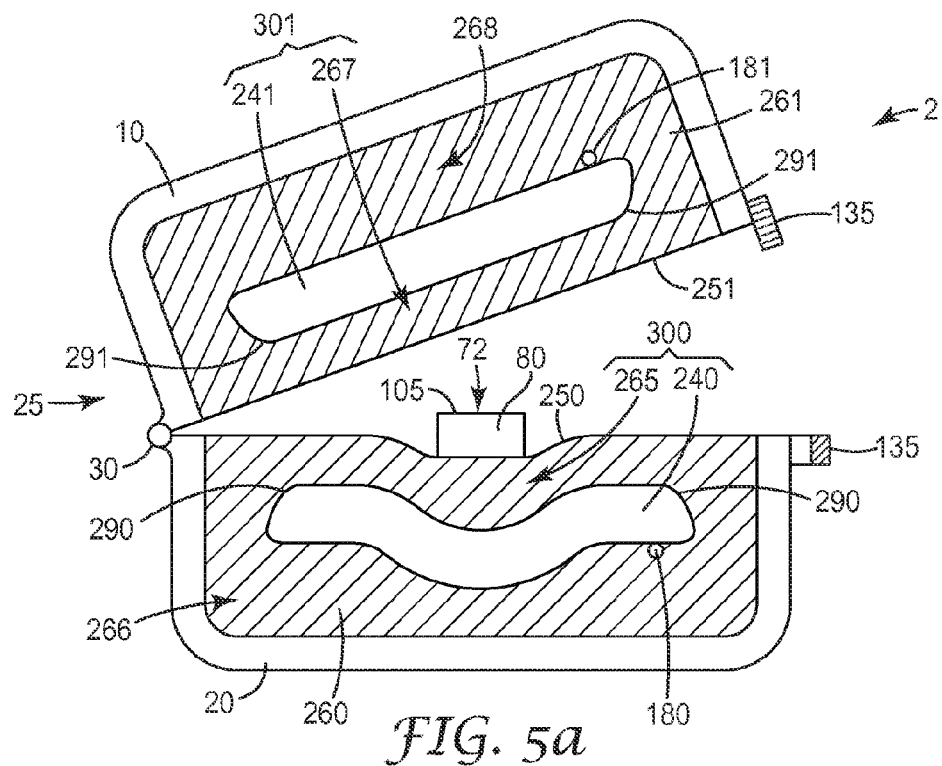
Figure 6A:
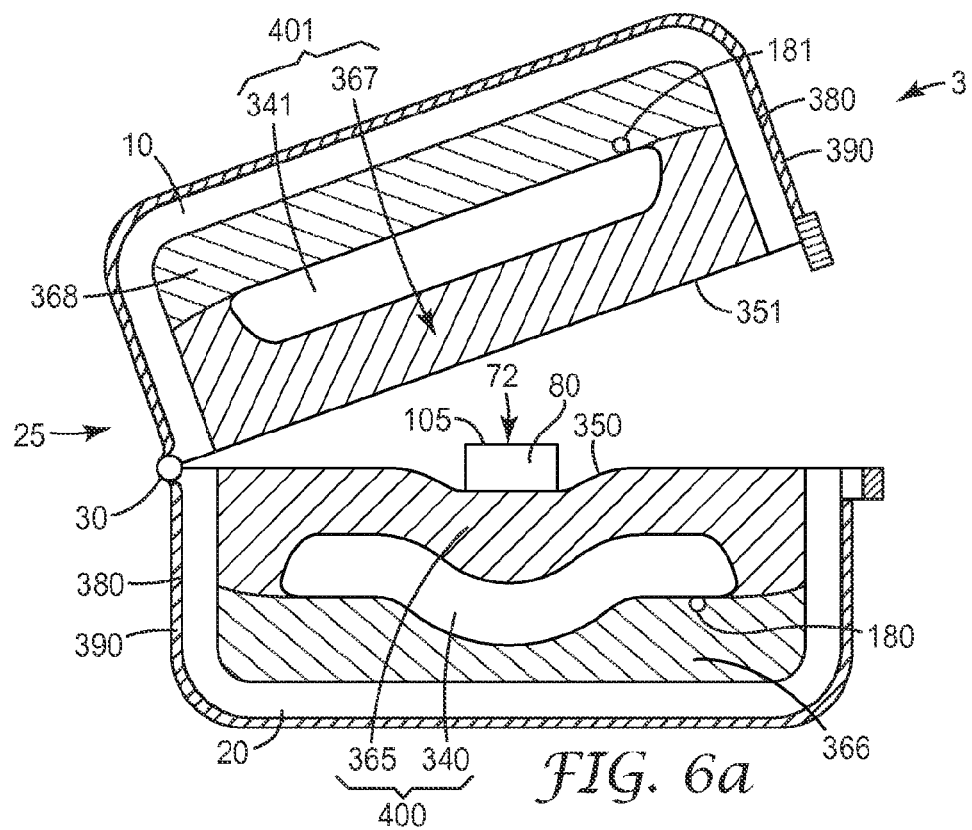
Figure 7A:
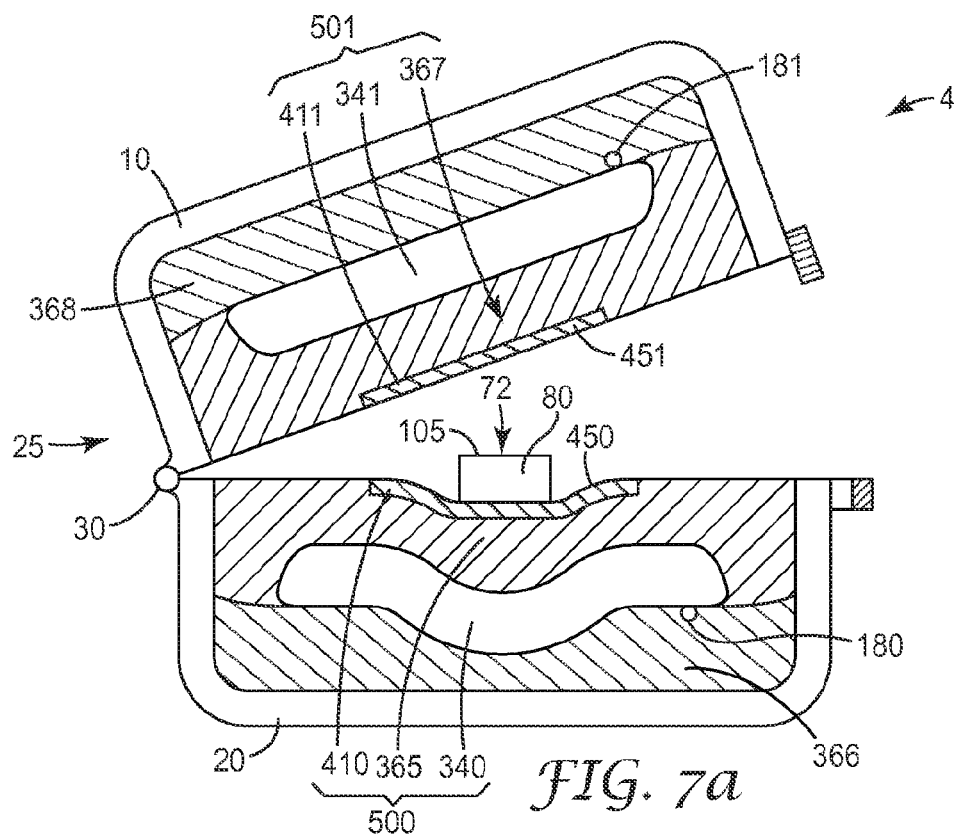
Figure 8A:
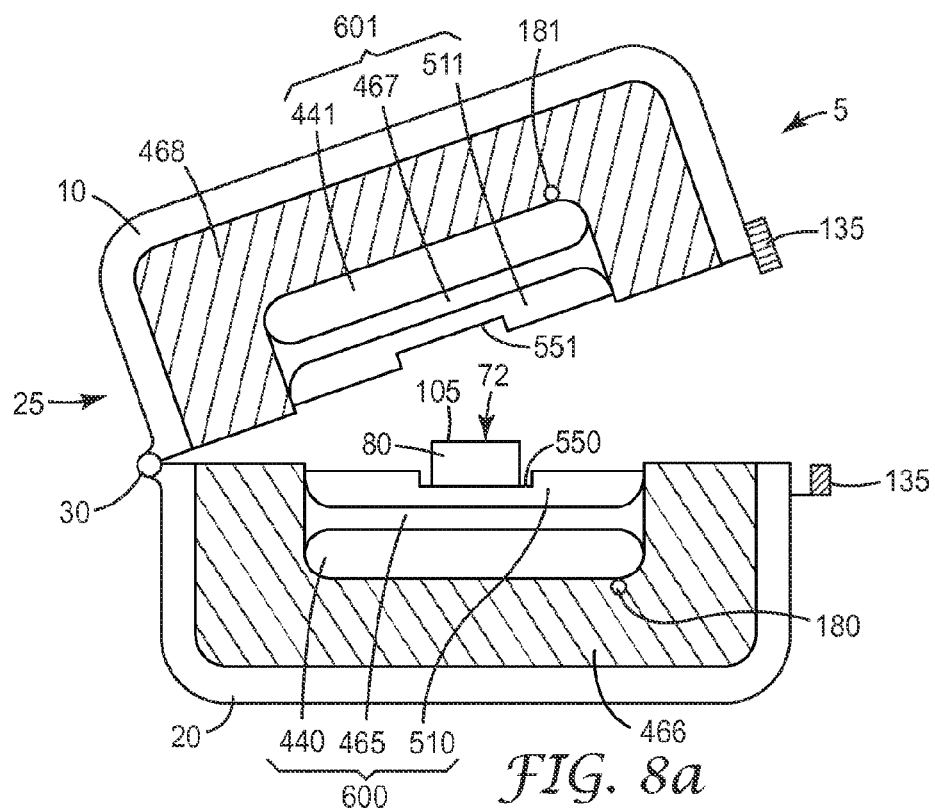

FIG. 1 A first closure according to the disclosure, on an insulated power cable;

FIG. 2a, b Schematic cross section of the closure and the cable of FIG. 1, open and closed;

FIG. 3 Perspective view of the closure of FIGS. 1, 2a and 2b, and an insulated power cable;

FIG. 4 A second closure according to the disclosure, on a bus bar;

FIG. 5a, b Schematic cross section of the closure and the cable of FIG. 4, open and closed;

FIG. 6a, b Schematic cross section of a third closure according to the disclosure, open and closed;

FIG. 7a, b Schematic cross section of a fourth closure according to the disclosure, open and closed; and FIG. 8a, b Schematic cross section of a fifth closure according to the disclosure, open and closed.

FIG. 1 is a schematic view of a first closure 1 according to the disclosure. The closure 1 is generally of a longitudinal box shape and has an essentially rectangular cross section. It comprises a first half-shell 10 and a second half-shell 20, which can be engaged with each other to form a housing 25. The half-shells 10, 20 are mechanically connected with each other by a hinge portion 30, located at a long side 40 of the closure 1. The half-shells 10, 20 can be pivoted about the hinge portion 30 between a position in which the housing 25 of the closure 1 is open ("open position"), and a further position, in which the housing 25 is closed ("closed position"). The housing 25 is shown in the closed position in FIG. 1. In the closed position, the half-shells 10, 20 can be engaged with each other on a further long side 50 of the closure 1.

The closure 1 receives, between the half-shells 10, 20, a section of a medium-voltage conductor assembly 71. For that purpose, the housing 25 can be closed around the conductor assembly 71. In the embodiment shown in FIG. 1, the conductor assembly is an insulated medium-voltage power cable 71. The cable 71 comprises a longitudinal power-carrying conductor 80, an insulating layer 90, a semiconductive layer 100, a shielding layer 102, and an outer cable sheath 104. Other cables comprise an electrically conductive layer instead of the semiconductive layer 100, which does not change the function of the closures described herein. Generally, the degree of conductivity of the semiconductive layer 100 or of a corresponding conductive layer is not essential to the invention.

The insulating layer 90 is arranged concentrically around the conductor 80 and directly on the conductor 80. The semiconductive layer 100 is arranged concentrically around the conductor 80 and directly on the insulating layer 90. It is normally electrically connected to ground at a location outside the closure 1. The outer cable sheath 104 is the radially outermost layer of the cable 71.

In FIG. 1, like in all other Figures, the conductor 80 defines axial directions, indicated by a double arrow 110, and radial directions, perpendicular to the axial directions 110. Two of the radial directions are indicated by a double arrow 120. At any given point along the conductor assembly 71, the axial directions 110 are directions along the longitudinal extension of the conductor 80. At any given point along the conductor assembly 71, radial directions 120 are directions perpendicular to the longitudinal extension of the conductor 80. An axial direction is thus a direction along the longitudinal conductor 80, while radial directions 120 are directions pointing away from a center of the conductor assembly 71, perpendicular to the longitudinal extension of the conductor 80. Directions defined relative to the conductor 80 can be used to describe directions of the closure 1, because the closure 1 can receive the conductor assembly 71 in specific orientations only. An axial direction of the closure 1, for example, corresponds to an axial direction of the conductor 80 in a state where the closure 1 receives the conductor assembly 71.

The housing 25 of the closure 1 is made of an electrically non-conductive polymeric material, namely ABS (Acrylo Nitrile Butadiene Styrene), for providing a degree of safety for a person installing the closure 1 on the cable 71 and for environmental stability. ABS is a preferred material due to its low cost and its mechanical and electrical properties, but other non-conductive materials can be used as well. The cable 71 enters the closure 1 at a cable entry portion 130 of the housing 25, at one axial end of the housing 25, namely the upper end in FIG. 1. A corresponding cable entry portion 130 is located at the opposite axial end of the housing 25, but it is not visible in FIG. 1. The cable entry portions 130 are formed by corresponding shapes in the half-shells 10, 20. The cable entry portions 130 provide respective openings through which the cable 71 can enter and exit the housing 25 of the closure 1.

A schematic cross section of the closure 1 and the cable 71 of FIG. 1, taken in the plane A shown in FIG. 1, is shown in FIGS. 2a and 2b with the housing 25 in an open and in a closed position, respectively. Plane A is defined by its surface normal being parallel to the axial directions 110 of the conductor 80 of the cable 71. FIG. 2a shows the housing 25 of the closure 1 in the open position. The upper half-shell 10 and the lower half-shell 20 are not engaged with each other at the long side 50 opposite to the long side 40 next to the hinge portion 30. The half-shells 10, 20 stand ajar, with an axial section of the insulated cable 71 arranged between them. Each half-shell 10, 20 has locking means 135, arranged at their long sides opposite to the hinge sides, which can be engaged with each other such as to engage the shells 10, 20 with each other and to close the closure 1.

The lower half-shell 20 of the closure 1 comprises a first sensing electrode 140. When not deformed, its cross section has the shape of a thin rectangle. The first sensing electrode 140 extends in the long direction of the closure 1, i.e. in the directions perpendicular to the plane of the drawing. The first sensing electrode 140 is electrically conductive and conformable. The first sensing electrode 140 is movable relative to the housing 25 and can conform around the cable 71. The first sensing electrode 140 has a contact surface 150 for mechanically contacting the cable 71. The first sensing electrode 140, in this embodiment, is an electrode assembly 200. The first sensing electrode 140 is a movable portion of that electrode assembly 200.

An axial section of the cable 71 which is received by the closure 1 is stripped, i.e. the outer cable sheath 104 and the cable shielding 102 have been removed, such as to expose the semiconductive layer 100. In a section of the cable 71 at which the first sensing electrode 140 is to contact the cable 71, the cable 71 is stripped further such as to expose the insulating layer 90. In that section, the radially outer surface of the insulating layer 90 forms an outer surface 105 of the cable 71. The cable 71 is stripped down to the insulating layer 90, so that the first sensing electrode 140 can mechanically contact the outer surface 105 of the cable 71.

Between the housing 25 and the first sensing electrode 140, an electrically insulating, resilient polymeric foam 160 is arranged. The foam 160 acts as an urging means. It urges the electrode 140, relative to the housing 25, towards the cable 71, when the closure 1 is closed (shown in FIG. 2b). By urging the first sensing electrode 140 towards the cable 71, an intimate mechanical surface contact is established between the contact surface 150 of the first sensing electrode 140 and the outer surface 105 of the cable 71. Such an intimate surface contact between the sensing electrode 140 and the outer surface 105 of the cable insulating layer 90 reduces the probability of having air pockets between the sensing electrode 140 and the insulating layer 90. Such air pockets increase the risk of partial discharges occurring between the sensing electrode 140 and the conductor 80 of the cable 71, which can lead to failure of the cable 71.

In the embodiment shown in FIGS. 1 and 2a, the urging means is a resilient foam 160 made of polyurethane. The foam 160 is electrically insulating. The foam 160 forms a separate element, that can be removed as a whole from the housing 25 of the closure 1. In alternative embodiments, the urging means may be a foam that is attached to the housing 25, e.g. an adhesive foam. In other embodiments, the urging means may be a spring-loaded mechanical element or a gel. Generally, a foam, a spring-loaded element or a gel may exert pressure on the first sensing electrode 140 and thereby urge it towards the cable 71 by plastic mechanical deformation of the urging means. In all embodiments, the housing 25 acts as a support for the urging means, so that the urging means can urge the movable portion of the electrode assembly 200, i.e. the first sensing electrode 140, towards the cable 71 when the housing 25 is closed around the cable 71 by engaging the half-shells 10, 20 with each other.

In the embodiment shown in FIG. 2a, the first sensing electrode 140 is an electrically conductive metal foil on the surface of the foam 160 facing the cable 71. Due to the material properties of the foil, the first sensing electrode 140 is conformable. Because the foil is thin and conformable, it can conform around the stripped cable 71 when being urged towards the cable 71 and onto the outer surface 105 of the cable 71.

Independent of the urging means, the first sensing electrode 140 can take various forms. It can, for example, comprise a conductive metal foil or a conductive metallized foil. Generally, a foil is thin and thereby conformable, so that the first sensing electrode 140 can conform to cables 71, and stripped cables 71, of different outer diameters. In other embodiments, the first sensing electrode 140 comprises a solid, non-conformable metal element, that is shaped suitably for an extended surface contact with the outer surface 105 of a stripped cable 71 of a specific diameter. By urging the first sensing electrode 140 towards the cable 71, the surface contact may become tighter and better, i.e. with a greater contact area and/or less gaps between the first sensing electrode 140 and the cable 71.

Also the upper half-shell 10 of the closure 1 comprises a sensing electrode, namely a second sensing electrode 141. The second sensing electrode 141 is identical to the first sensing electrode 140. It forms a second electrode assembly 201. The second sensing electrode 141 extends in the long direction of the closure 1, i.e. in the directions perpendicular to the plane of the drawing, generally parallel to the first sensing electrode 140. The second sensing electrode 141 has a contact surface 151 for mechanically contacting the cable 71. When not in mechanical contact with the cable 71, the second sensing electrode 141 is essentially flat. A second urging means, namely a resilient polymeric foam 161, is arranged between the upper half-shell 10 of the housing 25 and the second sensing electrode 141. It urges the second sensing electrode 141, relative to the housing 25, towards the cable 71, when the housing 25 is closed around the cable 71, so that an intimate mechanical surface contact is established between the contact surface 151 of the second sensing electrode 141 and the outer surface 105 of the cable 71. As described above for the first sensing electrode 140, such an intimate surface contact between the second sensing electrode 141 and the outer surface 105 of the cable insulating layer 90 reduces the probability of having air pockets between the second sensing electrode 141 and the insulating layer 90, which can lead to failure of the cable 71.

FIG. 2b is a schematic cross section of the housing 25 of FIGS. 1 and 2a closed around the cable 71, with the half-shells 10, 20 engaged with each other and the respective locking means 135 engaged with each other. The first foam 160 urges the first sensing electrode 140 against the insulating layer 90 of the cable 71 from the bottom (in FIG. 2b), and the second foam 161 urges the second sensing electrode 141 against the insulating layer 90 of the cable 71 from the top. Beyond a certain radial distance from the cable 71, the first and the second electrodes 140, 141 contact each other mechanically and electrically. Although the sensing electrodes 140, 141 are conformable, a gap 170 remains on either side of the cable 71, delimited by the sensing electrodes 140, 141 and the cable 71. Such a gap, if filled with air, poses a risk of partial electrical discharges. In order to reduce this risk, the stripped cable 71 is covered with an electrically insulating grease. This grease fills the gaps 170 and thereby reduces the risk of partial discharges in the area of the gaps 170.

The closure 1 is adapted for measuring the electrical potential, i.e. the voltage, of the conductor 80 of the cable 71 around which the housing 25 is closed, relative to electrical ground: The first sensing electrode 140 is operable as a first capacitor electrode of a sensing capacitor. This sensing capacitor further comprises the conductor 80 of the cable 71 as a second capacitor electrode and the insulating layer 90 of the cable 71 as a dielectric. The insulating layer 90 is operable as a dielectric of the sensing capacitor, because it is arranged between the first and second capacitor electrodes, i.e. between the conductor 80 and the first sensing electrode 140.

Sensing the voltage of the conductor 80 is done by using a capacitive voltage divider between the conductor 80 and electrical ground. The sensing capacitor explained above is the first dividing capacitor in this capacitive voltage divider. The voltage divider comprises a second dividing capacitor (not shown in FIGS. 2a and 2b), which is electrically connected in line between the first dividing capacitor and electrical ground. This second dividing capacitor is a discrete electronic component, arranged outside the closure 1 on a printed circuit board ("PCB") (not shown). A conductive wire 180 electrically connects the first dividing capacitor, i.e. the sensing capacitor formed by the first sensing electrode 140, the conductor 80, and the insulating layer 90, with the second dividing capacitor outside the closure 1. An end portion of the wire 180 is soldered to the first sensing electrode 140, so that the wire 180 is mechanically and electrically connected to the first sensing electrode 140. The wire 180 is routed to an outside of the closure 1 and further to the PCB, on which the second dividing capacitor is arranged. The electrical potential of the first sensing electrode 140 of the sensing capacitor is thereby made available on the PCB.

Outside of the closure 1, the cable 71 is not stripped, and its semiconductive layer 100 is still present. This semiconductive layer 100 is normally held at electrical ground. The semiconductive layer 100 is electrically connected to a ground contact on the PCB. The voltage between the first sensing electrode 140 and the semiconductive layer 100 is thus proportional to the electrical potential, i.e. the voltage, of the conductor 80 relative to electrical ground. By applying suitable calibration factors, which take into account properties of the dielectric inter alia, the voltage of the conductor 80 relative to electrical ground can be determined. In certain alternative embodiments, the second dividing capacitor is not a discrete electronic component, but comprises separate elements. In certain other alternative embodiments, the PCB is arranged inside the closure 1. If the PCB is arranged inside the closure 1, the PCB may be electrically connected with the first sensing electrode 140 or with the second sensing electrode 141 by a wire 180 or by a direct mechanical contact between an electrical contact on the PCB and the first sensing electrode 140 or the second sensing electrode 141, respectively.

In the embodiment shown in FIGS. 1, 2a and 2b, the housing 25 of the closure 1 is electrically non-conductive. In certain alternative embodiments, the housing 25 may be electrically conductive or comprise an electrically conductive layer, such as to form an electrically conductive envelope around the interior of the closure 1. In those embodiments, the housing 25 may provide some electromagnetic shielding between the outside of the closure 1 and the inside of the closure 1. Such a shielding may help to enhance the accuracy of sensing the voltage of the conductor 80.

The housing 25 of the closure 1 can be closed by engaging the two half-shells 10, 20 with each other and by engaging the locking means 135 of the respective half-shells 10, 20 with each other. The locking means 135 can be designed such that the closure 1 can be re-opened, after it has been closed. The closure 1 may thus be a re-enterable closure 1. After re-opening the closure 1, the closure 1 appears as shown in FIG. 2a again. Re-opening allows to inspect or repair elements in the closure 1. It also may allow for removing the closure 1 from its position on the conductor assembly 71 and for using it on a different position of the same conductor assembly 71 or for using it on a different conductor assembly 71.

The closure 1 can receive a cable, or generally, a conductor assembly 71, of different outer sizes and/or outer diameters or differently shaped cross sections. This is due to the presence of the urging means 160, which is adapted to urge the first sensing electrode 140, i.e. the first electrode assembly 200, towards the conductor assembly 71. It urges the first electrode assembly 200 far enough to establish a mechanical surface contact between the first electrode assembly 200 and the outer surface 105 of the conductor assembly 71. The fact that the first sensing electrode 140 of the closure 1 shown in FIGS. 1, 2a and 2b is conformable, allows to obtain an improved surface contact between the first electrode assembly 200 and the outer surface 105 of the conductor assembly 71, for conductor assemblies 71 having various outer sizes or differently shaped cross sections.

FIG. 3 is a perspective view of the first closure 1 shown in FIGS. 1, 2a and 2b. The closure 1 is shown open. Beyond what was described in the context of FIGS. 1, 2a and 2b, FIG. 3 shows more details of the cable entry portions 130 of the closure 1, the stripped cable 71 and auxiliary electrodes, arranged on both axial sides of the first and second sensing electrodes 140, 141.

Further to the first sensing electrode 140 and the second sensing electrode 141, the closure 1 comprises four electrically conductive auxiliary electrodes 142, 143, 144, 145. The first auxiliary electrode 142 is arranged on one side (the left-hand side in FIG. 3) of the first sensing electrode 140, spaced in an axial direction 110 from the first sensing electrode 140, and separated from the first sensing electrode 140 by a non-conductive first inter-electrode gap 191. In the embodiment shown in FIG. 3, the first inter-electrode gap 191 is about 1 mm wide. It allows to hold the first sensing electrode 140 and the first auxiliary electrode 142 on different electrical potentials. The first sensing electrode 140 comprises a rectangular piece of metal foil. Also the first auxiliary electrode 142 comprises a rectangular piece of metallic foil. One edge of the foil of the first auxiliary electrode 142 is arranged parallel to an edge of the foil of the first sensing electrode 140. The two pieces of foil are separated from each other by the first inter-electrode gap 191. The two pieces of foil are essentially flat and are arranged essentially in the same geometric plane. The piece of resilient, insulating foam 160, which urges the first sensing electrode 140 towards the cable 71 when the closure 1 is closed, extends in an axial direction far enough to urge also the first auxiliary electrode 142 towards the cable 71 when the closure 1 is closed.

In the opposite half-shell 10, the second auxiliary electrode 143 is arranged on the same side (the left-hand side in FIG. 3) of the second sensing electrode 141, spaced in the same axial direction 110 from the second sensing electrode 141 as the first auxiliary electrode 142 is spaced from the first sensing electrode 140. Also the second auxiliary electrode 143 comprises a piece of conductive metal foil. The piece of foil is essentially flat and is arranged essentially in the same geometric plane as the piece of foil forming the second sensing electrode 141. The piece of resilient, insulating foam 161, which urges the second sensing electrode 141 towards the cable 71 when the closure 1 is closed, extends in an axial direction far enough to urge also the second auxiliary electrode 143 towards the cable 71 when the closure 1 is closed. The second auxiliary electrode 143 is separated from the second sensing electrode 141 by a non-conductive second inter-electrode gap 192. The second inter-electrode gap 192 allows to hold the second sensing electrode 141 and the second auxiliary electrode 143 on different electrical potentials. The first inter-electrode gap 191 and the second inter-electrode gap 192 are aligned with each other, so that the first sensing electrode 140 and the second auxiliary electrode 143 remain mechanically and electrically separated from each other, and so that the second sensing electrode 141 and the first auxiliary electrode 142 remain mechanically and electrically separated from each other, when the closure 1 is closed.

The second sensing electrode 141 comprises a rectangular piece of metal foil. Also the second auxiliary electrode 143 comprises a rectangular piece of metallic foil. One edge of the foil of the second auxiliary electrode 143 is arranged parallel to an edge of the foil of the second sensing electrode 141. The two pieces of foil are essentially flat and are arranged essentially in the same geometric plane. When the housing 25 is closed around the cable 71, the first auxiliary electrode 142 and the second auxiliary electrode 143 are urged towards the cable 71 and are therefore in mechanical and electrical contact with each other. Since the auxiliary electrodes 142, 143 are both conductive, they are thereby on the same electrical potential. Between them, a section of the cable 71 is arranged. The cable 71 is stripped such that an axial section of the semiconductive layer 100 of the cable 71 is exposed in the area between the first and the second auxiliary electrodes 142, 143. When the housing 25 is closed around the cable 71, such that the sensing electrodes 140, 141 are in contact with the insulating layer 90 of the cable 71, the first and the second auxiliary electrodes 142, 143 are thereby in mechanical and electrical contact with the semiconductive layer 100 of the cable 71. The first and the second auxiliary electrodes 142, 143 and the semiconductive layer 100 of the cable 71 are thus on the same electrical potential. Because the semiconductive layer 100 of the cable 71 is normally held at electrical ground, the first and the second auxiliary electrodes 142, 143 are thus also normally at electrical ground. The grounded first and second auxiliary electrodes 142, 143 in the vicinity of the first and second sensing electrodes 140, 141 protect the sensing electrodes 140, 141 from stray fields and thereby help provide a cleaner signal from the sensing electrodes 140, 141. This enhances the accuracy of sensing the voltage of the inner conductor 80 via the sensing electrodes 140, 141.

In order to further enhance the accuracy, a third auxiliary electrode 144 and a fourth auxiliary electrode 145 are provided. They are arranged on the opposite side (the right-hand side in FIG. 3) of the first and second sensing electrodes 140, 141, respectively. These auxiliary electrodes 144, 145 also each comprise a piece of conductive metal foil. They are axially spaced and separated from the first and second sensing electrodes 140, 141 by a third inter-electrode gap 193 and a fourth inter-electrode gap 194, respectively. The third gap 193 and the fourth gap 194 are aligned, so that the first sensing electrode 140 and the fourth auxiliary electrode 145 remain mechanically and electrically separated from each other, and so that the second sensing electrode 141 and the third auxiliary electrode 144 remain mechanically and electrically separated from each other, when the closure 1 is closed. The third and fourth auxiliary electrodes 144, 145 are arranged in the same way as the first and the second auxiliary electrodes 142, 143, relative to each other and relative to the sensing electrodes 140, 141, and they perform the same function, on the other side (the right-hand side in FIG. 3) of the sensing electrodes 140, 141. In the second half-shell 20, the piece of resilient, insulating foam 160, which urges the first sensing electrode 140 and the first auxiliary electrode 142 towards the cable 71 when the closure 1 is closed, extends in an axial direction far enough to urge also the third auxiliary electrode 144 towards the cable 71 when the closure 1 is closed. In the opposed half-shell 10, the piece of resilient, insulating foam 161, which urges the second sensing electrode 141 and the second auxiliary electrode 143 towards the cable 71 when the closure 1 is closed, extends in an axial direction far enough to urge also the fourth auxiliary electrode 145 towards the cable 71 when the closure 1 is closed. Only small portions of foam 160, 161 are visible in FIG. 3, because the pieces of foam 160, 161 are largely hidden from the view by the sensing electrodes 140, 141 and the auxiliary electrodes 142, 143, 144, 145. Portions of the pieces of foam 160, 161 are exposed in the areas of the inter-electrode gaps 191, 192, 193, 194.

The cable 71 has been stripped such that a further axial section of the semiconductive layer 100 of the cable 71 is exposed in the section that is located between the third and the fourth auxiliary electrodes 144, 145, when the closure 1 is closed. When the housing 25 is closed around the cable 71, such that the sensing electrodes 140, 141 are in contact with the insulating layer 90 of the cable 71, the third and the fourth auxiliary electrodes 144, 145 are in mechanical and electrical contact with that further section of the semiconductive layer 100 of the cable 71. The third and the fourth auxiliary electrodes 144, 145 and the semiconductive layer 100 of the cable 71 are thus on the same electrical potential. Because the semiconductive layer 100 of the cable 71 is normally held at electrical ground, the third and the fourth auxiliary electrodes 144, 145 are thus also normally at electrical ground. The grounded third and fourth auxiliary electrodes 144, 145 in the vicinity of the first and second sensing electrodes 140, 141 further protect the sensing electrodes 140, 141 from stray fields and thereby help provide an even cleaner signal from the sensing electrodes 140, 141. This further enhances the accuracy of sensing the voltage of the inner conductor 80 via the sensing electrodes 140, 141.

In order to provide further protection of the sensing electrodes 140, 141 from electrical fields, and in order to render the electrical field in the vicinity of the first sensing electrode the first auxiliary electrode 142 and the third auxiliary electrode 144 are electrically connected with each other. This connection is provided by an insulated wire (not shown), exposed conductive end portions of which are in electrical and mechanical contact with the first auxiliary electrode 142 and the third auxiliary electrode 144, respectively. Alternatively, a conductive shielding layer, e.g. as illustrated in FIG. 6a, which may be applied on an inner surface of the upper half-shell 20 or on an outer surface of the upper half-shell 20, may establish an electrical connection between the first auxiliary electrode 142 and the third auxiliary electrode 144. In such a closure, the first auxiliary electrode 142 may be electrically connected to the shielding layer, e.g. by a wire or a conductive foil, in one location, and the third auxiliary electrode 144 may also be electrically connected to the shielding layer, e.g. by a wire or a conductive foil, in another location.

The cable 71 is stripped such that outside the closure 1, the cable 71 is fully protected by the cable sheath 104. The axial section of the cable 71 located inside the closure 1 is gradually stripped such that in one section the insulating layer 90 is exposed. The axial extension of this section is larger than the axial extension of the first and second sensing electrodes 140, 141. In axial sections of the cable next to the exposed insulating layer 90, the cable 71 is stripped such that the semiconductive layer 100 of the cable 71 is exposed, which is arranged on the insulating layer 90.

The closure 1 shown in FIGS. 1, 2a, 2b and 3 does not provide for a sealing between the cable 71 and the housing 25. In an alternative closure, sealing means may be provided in the area of the cable entry portions 130, for preventing entry of dust, water and/or humidity into the closure. Such sealing means, e.g. a sealant gel, may be arranged in the closure when the closure is open, and may be forced into gaps between the closure and the cable sheath 104 as the closure is closed.

A second closure 2 according to the present disclosure is shown in a schematic perspective view in FIG. 4. Like the closure 1 of FIGS. 1, 2a and 2b, the second closure 2 has a housing 25 comprising two half-shells 10, 20, a hinge portion 30 on one side 40, and an opposite side 50 where the half-shells 10, 20 can be engaged with each other to close the housing 25. The housing 25 is essentially box-shaped. In these respects, the first closure 1 and the second closure 2 are identical.

The closure 2 receives, between the half-shells 10, 20, a section of a medium-voltage conductor assembly. In the embodiment shown in FIG. 4, the conductor assembly 72 is a bus bar. The conductor assembly 72 comprises a longitudinal power-carrying conductor 80 of rectangular cross section. The conductor assembly 72 has no insulating layer. The radially outer surface of the conductor 80 is also the outer surface 105 of the conductor assembly 72.

Figure 5B:
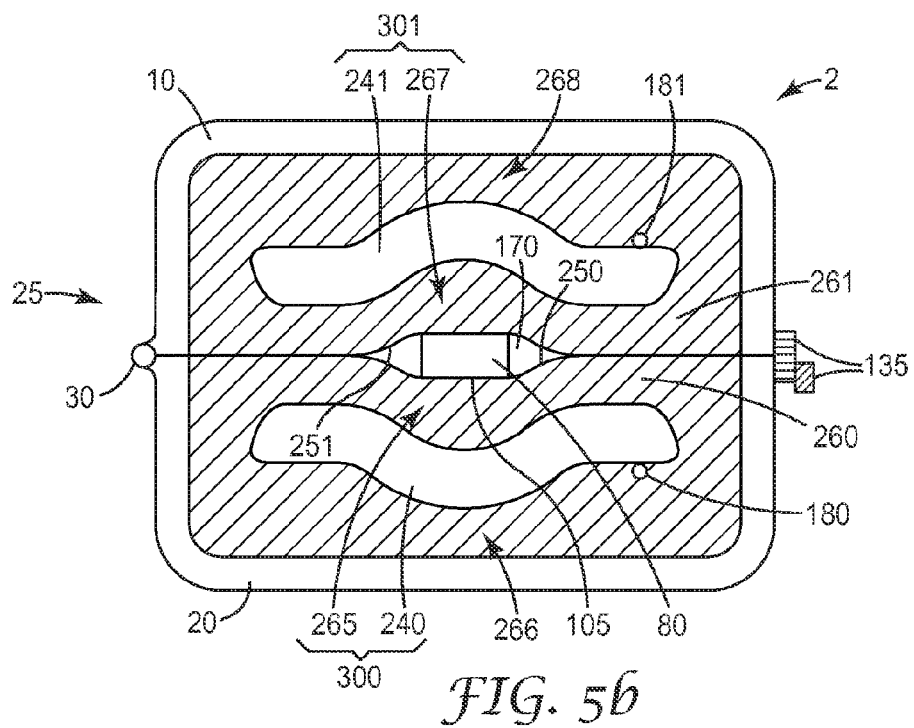

The first closure 1 and the second closure 2 differ in several aspects, related to the components inside the closures. These aspects will be explained with reference to FIGS. 5a, 5b, 6a and 6b. FIGS. 5a and 5b are schematic cross sections of the second closure 2, taken in the middle of the closure 2.

FIG. 5a shows a schematic cross section of the conductor assembly 72, i.e. the bus bar, and the closure 2 of FIG. 4 with the housing 25 of the closure 2 in an open state. The cross section is taken in a plane B, shown in FIG. 4. Plane B is defined by its surface normal being parallel to the axial directions of the conductor 80 of the bus bar. The upper half-shell 10 and the lower half-shell 20 of the second closure 2 are arranged around the conductor assembly 72, but the housing 25 is not closed around the conductor assembly 72. The closure 2 comprises a first sensing electrode 240, arranged in the lower shell 20, and a second sensing electrode 241, arranged in the upper shell 10. The sensing electrodes 240, 241 are electrically conductive bodies. The first sensing electrode 240 and the second sensing electrode 241 extend in the long direction of the closure 2, i.e. in the directions perpendicular to the plane of the drawing. The sensing electrodes 240, 241 are arranged generally parallel to each other, when the housing 25 is closed (as shown in FIG. 5*b*).

Figure 6B:
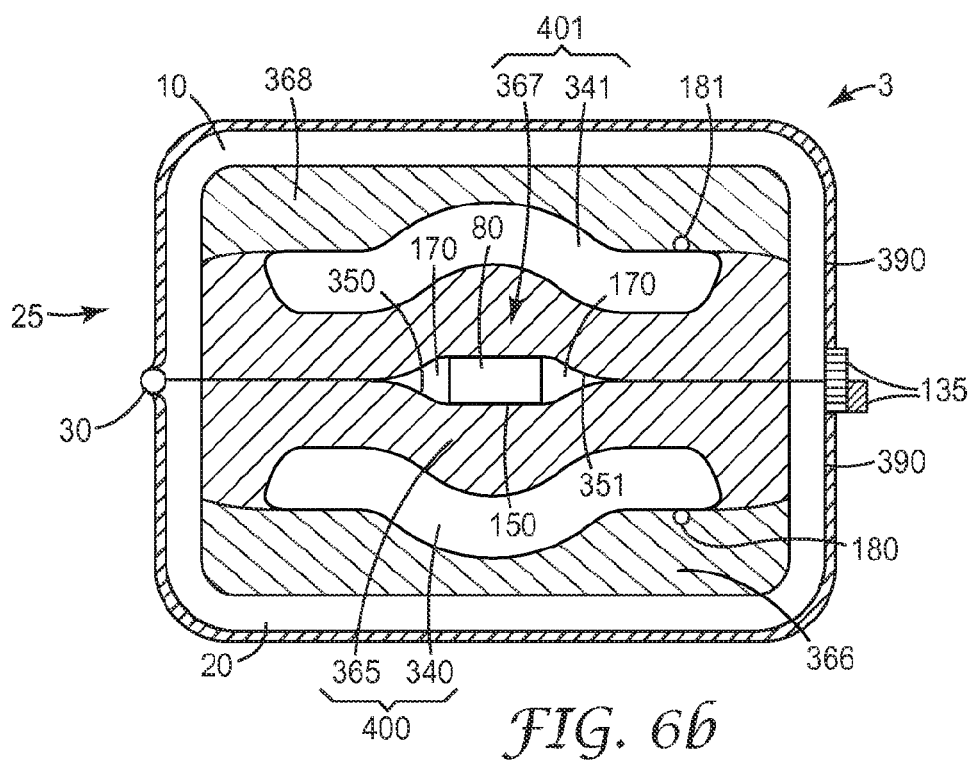

The first sensing electrode 240 is embedded in a first piece of foam 260. The first piece of foam 260 is resilient and electrically insulating. It comprises a first foam portion 265 and a second foam portion 266. The first foam portion 265 is the portion arranged between the conductor assembly 72 and the first sensing electrode 240. The first foam portion 265 forms an electrically insulating layer, arranged radially inward of the first sensing electrode 240, relative to the center of the conductor assembly 72. This first foam portion 265 and the first sensing electrode 240 form a first electrode assembly 300. This is different from the first closure 1, where only the first sensing electrode 140 forms the first electrode assembly 200. The second foam portion 266 is the portion of foam 260 which is arranged generally between the lower half-shell 20 of the housing 25 and the first sensing electrode 240. In the embodiment shown in FIGS. 5*a* and 5*b*, the first foam portion 265 and the second foam portion 266 are one element, integrally formed. Alternatively, they may be separate elements. This is shown in FIGS. 6*a* and 6*b*.

The second foam portion 266 is resilient, so that the first electrode assembly 300 is movable relative to the housing 25, for example, when the conductor assembly 72 is urged into the first foam portion 265 when the closure 2 is closed. A portion of the first foam portion 265 and a middle section of the first sensing electrode 240 are pushed, by the conductor assembly 72, towards the lower half-shell 20, so that the first foam portion 265 and the first sensing electrode 240 are deformed. This is shown in FIG. 5*a*. The shape of the first foam portion 265 and of the first sensing electrode 240 when not deformed is like shown in the upper half-shell 10.

The closure 2 is adapted for measuring the electrical potential, i.e. the voltage, of the conductor 80 of the conductor assembly 72 around which the closure 2 is arranged, relative to electrical ground: The first sensing electrode 240 is operable as a first capacitor electrode of a sensing capacitor. This sensing capacitor further comprises the conductor 80 of the conductor assembly 72 as a second capacitor electrode and the insulating first foam portion 265 of the electrode assembly 300 as a dielectric of the sensing capacitor. The first foam portion 265 is operable as a dielectric of the sensing capacitor, because it is arranged between the first and second capacitor electrodes, i.e. between the conductor 80 and the first sensing electrode 240. The measuring principle of capacitive voltage division is the same as described for the first closure 1 in the context of FIGS. 2*a* and 2*b*.

The cross section of the first sensing electrode 240 is formed like a rectangle with rounded corners. In cross section, the upper corners 290, i.e. those on the portion of the first sensing electrode 240 which are closer to the opposite, upper half-shell 10, are shaped according to a Rogowski profile. This profile minimizes the risk of electrical discharges between the conductor 80 and the first sensing electrode 240. The lower corners 291 of the second sensing electrode 241 are shaped in the same manner. Other types of profiles can be used alternatively for reducing the risk of discharges.

The first foam portion 265 of the electrode assembly 300 conforms around the conductor assembly 72. The first electrode assembly 300 has a contact surface 250 for mechanically contacting the conductor assembly 72.

In the embodiment shown in FIGS. 4, 5*a* and 5*b*, the electrically insulating, resilient second foam portion 266 forms an urging means. It urges the first electrode assembly 300, relative to the housing 25, towards the conductor assembly 72, when the housing 25 is closed around the conductor assembly 72 (shown in FIG. 5*b*). By urging the first electrode assembly 300 towards the conductor assembly 72, an intimate mechanical surface contact is established between the contact surface 250 of the first electrode assembly 300 and the outer surface 105 of the conductor assembly 72. Such an intimate surface contact between the first electrode assembly 300 and the outer surface 105 of the conductor 80 of the conductor assembly 72 reduces the probability of having air pockets between the first electrode assembly 300 and the conductor 80. Such air pockets increase the risk of partial discharges occurring between the first sensing electrode 240 and the conductor 80 of the conductor assembly 72, which can lead to failure of the conductor assembly 72 or of the closure 2.

The foam 260 is a polyurethane material. The foam 260 and the first sensing electrode 240 form a separate element, that can be removed as a whole from the housing 25 of the closure 2. In alternative embodiments, the urging means may be a second foam portion 266, separate from the first foam portion 265, that is attached to the housing 25, e.g. an adhesive foam. In other embodiments, the urging means may be a spring-loaded mechanical element or a gel.

Generally, and independent of specific embodiments, urging means like, e.g., a foam, a spring-loaded element or a gel may exert pressure on the first electrode assembly 200, 300 as a whole or on a movable portion of the first electrode assembly 200, 300, and hereby urge the first electrode assembly 200, 300 or the movable portion of the electrode assembly 200, 300 towards the cable 71 or the conductor assembly 72 by plastic mechanical deformation of the urging means. In all embodiments, the housing 25 acts as a support for the urging means, so that the urging means can urge the first electrode assembly 200, 300 towards the conductor assembly, i.e. towards the cable 71 or the bus bar 72, when the housing 25 is closed around the respective conductor assembly 71, 72.

The upper half-shell 10 of the closure 2 is similar to the lower half-shell 20. In the upper half-shell 10, a further, second electrode assembly 301 and a further urging means 268 is arranged. The second sensing electrode 241 is embedded in a second piece of foam 261. The second piece of foam 261 is also resilient and electrically insulating. It comprises a third foam portion 267 and a fourth foam portion 268. The third foam portion 267 is the portion arranged between the conductor assembly 72 and the second sensing electrode 241, when the housing 25 is closed around the conductor assembly 72. This third foam portion 267 and the second sensing electrode 241 form the second electrode assembly 301. The fourth foam portion 268 is the portion of the second piece of foam 261 which is arranged generally between the upper half-shell 10 of the housing 25 and the second sensing electrode 241. In the embodiment shown in FIGS. 5*a* and 5*b*, the third foam portion 267 and the fourth foam portion 268 are one element, integrally formed. Alternatively, they may be separate elements, as shown in FIGS. 6*a* and 6*b*.

The fourth foam portion 268 is resilient, so that the second electrode assembly 301 is movable relative to the housing 25. When the housing 25 is closed around the conductor assembly 72, a portion of the third foam portion 267 and a middle section of the second sensing electrode 241 are pushed by the conductor assembly 72 towards the upper half-shell 20, so that the third foam portion 265 and the second sensing electrode 241 are deformed. This is shown in FIG. 5b.

The third foam portion 267 of the second electrode assembly 301 can conform at least partially around the conductor assembly 72. The second electrode assembly 301 has a contact surface 251 for mechanically contacting the conductor assembly 72.

In the embodiment shown in FIGS. 4, 5a and 5b, the electrically insulating, resilient fourth foam portion 268 forms an urging means. It urges the second electrode assembly 301, relative to the housing 25, towards the conductor assembly 72, when the closure 2 is closed (shown in FIG. 5b). By urging the electrode assembly 301 towards the conductor assembly 72, an intimate mechanical surface contact is established between the contact surface 251 of the second electrode assembly 301 and the outer surface 105 of the conductor assembly 72. Such an intimate surface contact between the second electrode assembly 301 and the outer surface 105 of the conductor 80 of the conductor assembly 72 reduces the probability of having air pockets between the second electrode assembly 301 and the conductor 80, thereby reducing the risk of partial discharges occurring between the second sensing electrode 241 and the conductor 80 of the conductor assembly 72.

The second sensing electrode 241 can be used for sensing the voltage of the conductor 80 in the same way as described above for the first sensing electrode 240, i.e. the second sensing electrode 241 is operable as a first capacitor electrode of a sensing capacitor, which sensing capacitor further comprises the conductor 80 of the conductor assembly 72 as a second capacitor electrode and the third foam portion 267 as a dielectric. The same voltage divider technique can be used which has been described above for sensing the voltage of the conductor 80 versus electrical ground.

As in the first closure 1, a conductive wire 180 electrically connects the first dividing capacitor, i.e. the sensing capacitor formed by the first sensing electrode 240, the conductor 80, and the third foam portion 267, with the second dividing capacitor outside the closure 2. An end portion of the wire 180 is soldered to the first sensing electrode 240, so that it is mechanically and electrically connected to the first sensing electrode 240. The wire 180 is routed to an outside of the closure 2 and further to a PCB, on which the second dividing capacitor is arranged. The electrical potential of the first sensing electrode 240 of the sensing capacitor is thereby made available on the PCB. Electrical ground can be made available at a ground contact on the PCB by electrically connecting the ground contact of the PCB with an element held at electrical ground in the vicinity of the conductor assembly 72, outside the closure 2. The voltage between the first sensing electrode 240 and the ground contact of the PCB is thus proportional to the electrical potential, i.e. the voltage, of the conductor 80 relative to electrical ground. By applying suitable calibration factors, which take into account properties of the dielectric inter alia, the voltage of the conductor 80 relative to electrical ground can be determined.

In certain alternative embodiments, the PCB is arranged inside the closure 2. If the PCB is arranged inside the closure 2, the PCB may be electrically connected with the first sensing electrode 240 by the wire 180 or by a direct mechanical contact between an electrical contact on the PCB and the first sensing electrode 240.

Unlike in the first closure 1, the first and the second sensing electrodes 240, 241 of the second closure 2 are not in mechanical contact with each other when the closure 2 is closed. However, the first sensing electrode 240 and the second sensing electrode 241 are electrically connected with each other. This increases the effective area of the combined sensing electrode, which in turn increases its capacitance. A larger capacitance provides a stronger signal and a lower signal-to-noise ratio, which improves accuracy of the voltage sensing. Connecting the first and the second sensing electrodes 240, 241 can be achieved by a further, second conductive wire 181, connected to the second sensing electrode 241, which is electrically connected to the PCB (not shown) or to the first wire 180. The electrical connection between the first and the second sensing electrodes 240, 241 can be made on the PCB or elsewhere. Generally, this electrical connection may be switchable, so that at a first time, an electrical connection exists, while at a later time, no electrical connection exists or vice versa. Generally, when the second sensing electrode 241 is not electrically connected to the first sensing electrode 240, the second sensing electrode 241 can be used for other purposes, e.g. for energy harvesting, or for sensing the voltage of the conductor 80 independently from the first sensing electrode 240, in order to provide a second sensing value.

A further cross section of the second closure 2 of FIGS. 4 and 5a is shown in FIG. 5b. The closure 2 is shown in a closed state, wherein the housing 25 is closed around the conductor assembly 72, i.e. around the bus bar, and wherein the upper half-shell 10 and the lower half-shell 20 of the housing 25 are engaged with each other. The respective locking means 135 of the half-shells 10, 20 are engaged with each other to hold the closure 2 in the closed state. The second foam portion 266 urges the first electrode assembly 300 towards the conductor assembly 72 relative to the lower half-shell 20 of the housing 25. This establishes a mechanical surface contact between the contact surface 250 of the first electrode assembly 300 and the outer surface 105 of the conductor assembly 72. Similarly, the fourth foam portion 268 urges the second electrode assembly 301 towards the conductor assembly 72 relative to the upper half-shell 10 of the housing 25. This establishes a mechanical surface contact between the contact surface 251 of the second electrode assembly 301 and the outer surface 105 of the conductor assembly 72.

The mechanical surface contact between the first electrode assembly 300 and the conductor assembly 72 is further enhanced by the contact surface 250 of the first electrode assembly 300 being conformable. A portion of the first electrode assembly 300, located adjacent to the contact surface 250, comprises the contact surface 250, and this portion is conformable. The same applies to the second electrode assembly 301 and its contact surface 251.

At a certain distance from the bus bar 271, the first contact surface 250 and the second contact surface 251 are in mechanical contact with each other. As the first and second electrode assemblies 300, 301 are urged towards the conductor assembly 72 and thereby towards each other, this mechanical contact is tight. The tight contact helps avoiding air gaps between the electrode assemblies 300, 301. In the vicinity of the conductor assembly 72, however, the electrode assemblies 300, 301 are not in mechanical contact with each other, and form gaps 170. In order to reduce the risk of electrical discharges in the vicinity of the gaps 170, the outer surface 105 of the conductor assembly 72 is covered with an electrically insulating grease. This grease fills the gaps 170 when the housing 25 is closed around the conductor assembly 72, and thereby reduces the risk of partial discharges.

Each of the closures described above or below may be a re-enterable closure, as described above for the first closure 1.

The second closure 2 can receive a conductor assembly 72, such as a bus bar, or generally, of different outer sizes or differently shaped cross sections. This is due to the presence of the urging means 266, which is adapted to urge the first electrode assembly 300 or a movable portion of the first electrode assembly 300 towards the conductor assembly 72. It urges the first electrode assembly 300 or the movable portion of the first electrode assembly 300 far enough to establish a mechanical surface contact between the first electrode assembly 300 and the outer surface 105 of the conductor assembly 72. The fact that the first electrode assembly 300 of the closure 2 shown in FIGS. 4, 5*a* and 5*b* has a conformable portion and a conformable contact surface 250, provides an improved surface contact between the first electrode assembly 300 and the outer surface 105 of the conductor assembly 72, for conductor assemblies 72 having various outer sizes and cross sections of various shapes.

A third closure 3 is shown in cross section in FIGS. 6*a* and 6*b*. The third closure 3 is identical to the second closure 2 shown in FIGS. 5*a* and 5*b*, except for the urging means being separate from the respective electrode assemblies, and for the presence of a shielding layer.

FIG. 6*a* shows the third closure 3 in an open state, arranged around a conductor assembly 72, identical to the bus bar illustrated in FIGS. 4, 5*a* and 5*b*. The upper half-shell 10 and the lower half-shell 20 of the housing 25 are coated with an electrically conductive metal on an outer surface 380 of the housing 25. The coating forms a shielding layer 390 to provide electromagnetic shielding between the first sensing electrode 340 and the outside of the closure 3. The shielding layer 390 envelopes the first sensing electrode 340 and the conductor 80, when the housing 25 is closed around the conductor assembly 72. The shielding layer 390 on the upper half-shell 10 and the shielding layer 390 on the lower half-shell 20 are not electrically connected with each other, but for better shielding they may be electrically connected with each other.

The first sensing electrode 340 in the lower half-shell 20 is arranged between a first foam element 365 and a second foam element 366. Both foam elements 365, 366 are resilient and electrically insulating. The first foam element 365 is arranged between the first sensing electrode 340 and the conductor 80 of the conductor assembly 72, when the housing 25 of the closure 3 is closed around the conductor assembly 72. The first foam element 365 forms an electrically insulating layer, arranged radially inward of the first sensing electrode 340, relative to the center of the conductor 80. It is operable as a dielectric of a sensing capacitor, which further comprises the first sensing electrode 340 as the first capacitor electrode, and the conductor 80 as the second capacitor electrode. The sensing capacitor can be used in a capacitive voltage divider to sense a voltage of the conductor 80, as described above for the first closure 1.

The first sensing electrode 340 is identical to the first sensing electrode 240 of the second closure. It is attached to the first foam element 365. The first foam element 365 and the first sensing electrode 340 form a first electrode assembly 400. The first electrode assembly 400 has a contact surface 350 for mechanically contacting the outer surface 105 of the conductor 80. The first electrode assembly 400 is arranged inside the housing 25. It is movable relative to the housing 25, because the first foam element 365 is resilient. Because the first foam element 365 is resilient, the first electrode assembly 400 can be pushed towards the inner surface of the lower half-shell 20, when the housing 25 is closed around the conductor assembly 72, as shown in FIG. 6*b*.

The second foam element 366 is a separate element from the first foam element 365. It is made from a different foam material than the first foam element 365. The second foam element 366 is an urging means that can urge the first electrode assembly 400, relative to the lower half-shell 20 of the housing 25, towards the bus bar, or generally, towards the conductor assembly 72, when the closure 3 receives the conductor assembly 72 and when the housing 25 is closed around the conductor assembly 72. Thereby, the second foam element 366 establishes a mechanical surface contact between the contact surface 350 of the first electrode assembly 400 and the outer surface 105 of the conductor assembly 72. The urging means, i.e. the second foam element 366, is resilient. Inside the housing 25, the second foam element 366 is attached to the lower half-shell 20 adhesively. Alternatively, it may not be attached to the lower half-shell 20, but placed loosely inside the lower half shell 20, so that it can be easily removed from the housing 25. The second foam element 366 is also attached adhesively to the first electrode assembly 400. This allows the first electrode assembly 400 and the second foam element 366 to be removed from the housing 25 together, when the closure 3 is open. Alternatively, the second foam element 366 may contact the first electrode assembly 400 without being attached to it, so that the two elements can be removed sequentially from the housing 25, when the closure 3 is open.

The upper half-shell 10 contains a second sensing electrode 341, a third foam element 367 and a fourth foam element 368. The second sensing electrode 341 and the third foam element 367 form a second electrode assembly 401. The fourth foam element 368 is attached adhesively to the upper half-shell 10 and to the second electrode assembly 401. The fourth foam element 368 is an urging means which can urge the second electrode assembly 401, relative to the upper half-shell 10 of the housing 25, towards the conductor assembly 72, when the closure 3 receives the conductor assembly 72 and the housing 25 is closed around the conductor assembly 72. Thereby, the fourth foam element 368 establishes a mechanical surface contact between the contact surface 351 of the second electrode assembly 401 and the outer surface 105 of the conductor assembly 72.

The fourth foam element 368 is a separate element from the third foam element 367. It is made from a different foam material than the third foam element 367. The fourth foam element 368 is attached to the upper half-shell 10 adhesively. Alternatively, it may not be attached to the upper half-shell 10, but placed loosely inside the upper half-shell 10, so that it can be easily removed from the housing 25. The fourth foam element 368 is also attached adhesively to the second electrode assembly 401. This allows the second electrode assembly 401 and the fourth foam element 368 to be removed from the housing 25 together, when the closure 3 is open. Alternatively, the fourth foam element 368 may contact the second electrode assembly 401 without being attached to it, so that the two elements can be removed sequentially from the housing 25, when the closure 3 is open.

The second electrode assembly 401 comprises a contact surface 351 for mechanically contacting the conductor assembly 72, when the housing 25 is closed around the conductor assembly 72. The arrangement and the function of the elements in the third closure 3 are the same as those of the corresponding elements in the second closure 2. Also in the third closure, the first and the second sensing electrodes 340, 341 are preferably electrically connected with each other. The PCB mentioned in the context of FIGS. 5a and 5b can also be present in the embodiment of FIGS. 6a and 6b. The PCB can be arranged inside or outside of the closure 3.

FIG. 6b shows, in cross section, the third closure 3 of FIG. 6a in a closed state, with the housing 25 closed around the conductor assembly 72, i.e. around the bus bar. In the embodiment shown in FIGS. 6a and 6b, the conductor assembly 72 is a bus bar. The contact surface 350 of the first electrode assembly 400 and the contact surface 351 of the second electrode assembly 401 conform around the conductor assembly 72, which improves the surface contact between the respective electrode assembly 400, 401 and the conductor assembly 72. At a certain distance from the conductor assembly 72, the contact surfaces 350, 351 are in mechanical contact with each other. As the first and second electrode assemblies 400, 401 are urged towards the conductor assembly 72 and thereby towards each other, this mechanical contact is tight. The tight contact helps avoiding air gaps between the electrode assemblies 400, 401. In the vicinity of the conductor assembly 72, however, the electrode assemblies 400, 401 are not in mechanical contact with each other, and form gaps 170. As was mentioned before, in order to reduce the risk of electrical discharges in the vicinity of the gaps 170, the outer surface 105 of the conductor assembly 72 is covered with an electrically insulating grease. This grease fills the gaps 170 when the housing 25 is closed around the conductor assembly 72, and thereby reduce the risk of partial discharges.

Each of the closures 1, 2, 3 described above comprises a first sensing electrode 140, 240, 340 and a second sensing electrode 141, 241, 341. A second sensing electrode 141, 241, 341 is, however, not required for sensing a voltage of the conductor 80. Neither is a second electrode assembly 201, 301, 401 required for sensing a voltage of the conductor 80 of the conductor assembly 71, 72. The presence of a second electrode assembly 201, 301, 401 and a second sensing electrode 141, 241, 341, however, may increase the accuracy of the voltage sensing.

Figure 7B:
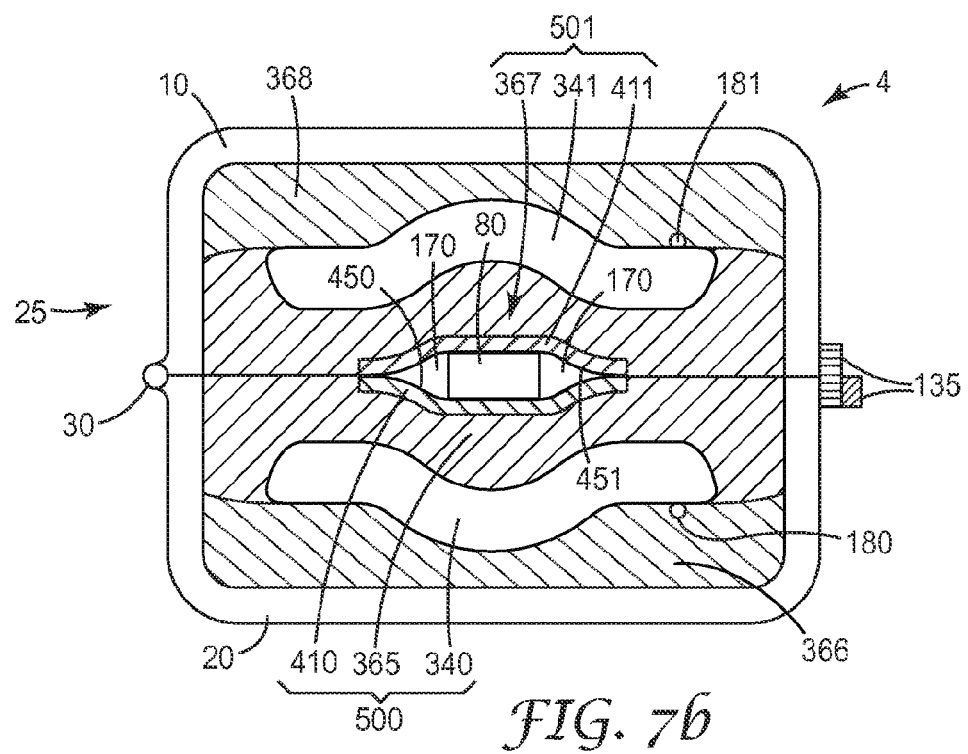

A fourth closure 4 is shown in cross section in FIGS. 7a and 7b. The fourth closure 4 is identical to the third closure 3 of FIGS. 6a and 6b, except for additional envelope elements. As shown in FIG. 7a, the first electrode assembly 500 comprises an electrically conductive first envelope element 410. The first envelope element 410 comprises the contact surface 450 of the first electrode assembly 500, which is for mechanically and electrically contacting the conductor 80 of the conductor assembly 72. In the embodiment shown in FIGS. 7a and 7b, the conductor assembly 72 is a bus bar. When the housing 25 is closed around the conductor assembly 72, as shown in FIG. 7b, the first envelope element 410 is in electrical and mechanical contact with the conductor 80, and thereby forms an extension of the conductor 80, i.e. a conductor extension 410. In this embodiment, the sensing capacitor for sensing a voltage of the conductor 80 comprises the first sensing electrode 340 as the first capacitor electrode, the conductor 80 with the conductor extension 410 as the second capacitor electrode, and the first foam element 365 as a dielectric. The first electrode assembly 500, comprising the first envelope element 410, is movable relative to the housing 25. When the housing 25 is closed around the conductor assembly 72, the second foam element 366 urges the first electrode assembly 500 towards the conductor assembly 72, whereby a mechanical surface contact between the contact surface 450 of the first electrode assembly 500 and the outer surface 105 of the conductor assembly 72 is established.

A second envelope element 411 is arranged in a corresponding location in the second electrode assembly 501. The first and the second envelope elements 410, 411 are electrically conductive. They are conductive because they comprise electrically conductive silicone. When the housing 25 is closed around the conductor assembly 72, as shown in FIG. 7b, also the second envelope element 411 is in electrical and mechanical contact with the conductor 80. Both envelope elements 410, 411 are conformable and conform around the conductor assembly 72. The first and the second envelope elements 410, 411 are shaped such as to mechanically and electrically contact each other, when the housing 25 is closed around the conductor assembly 72. When the housing 25 is closed, the envelope elements 410, 411 and the conductor 80 contact each other mechanically and electrically, and are therefore on the same electrical potential. For this reason, electrical discharges in gaps 170 between the envelope elements 410, 411 and the conductor 80 cannot occur. The use of insulating grease on the conductor assembly 72 is therefore not necessary.

A further, fifth closure 5 is shown in FIG. 8a in cross section. Again, the conductor assembly 72 is a bus bar. The fifth closure 5 is similar to the fourth closure 4 in that it has first and second enveloping elements 510, 511. The first electrode assembly 600 comprises the first enveloping element 510, the first sensing electrode 440 and a first spacing element 465. The first enveloping element 510, the first sensing electrode 440 and the first spacing element 465 are each solid. The first enveloping element 510 is a solid piece of electrically conductive metal. The first sensing electrode 440 is a solid piece of electrically conductive metal. The first spacing element 465 is a solid piece of electrically insulating ceramic. The first enveloping element 510, the first sensing electrode 440 and the first spacing element 465 are attached to each other such as to form the first electrode assembly 600. The first spacing element 465 forms an electrically insulating layer, which is arranged between the conductor 80 of the conductor assembly 72 and the first sensing electrode 440, when the housing 25 is closed around the conductor assembly 72. The entire first electrode assembly 600 is movable relative to the housing 25, because it is embedded in an electrically insulating, resilient foam element 466. The dimensions of the foam element 466 are chosen such that the first electrode assembly 600 is urged by the foam element 466, relative to the housing 25, towards the conductor assembly 72, when the housing 25 is closed around the conductor assembly 72. The foam element 466 is arranged in the housing 25, between the housing 25 and the first electrode assembly 600. The foam element 466 is an urging means 466 for urging the first electrode assembly 600 towards the conductor assembly 72, when the housing 25 is closed around the conductor assembly 72. By urging, a mechanical surface contact is established between the contact surface 550 of the first electrode assembly 600 and the outer surface 105 of the conductor assembly 72, when the housing 25 is closed around the conductor assembly 72.

The first enveloping element 510 comprises the contact surface 550 which is for mechanically and electrically contacting the conductor 80 of the conductor assembly 72. When the housing 25 is closed around the conductor assembly 72, the first enveloping element 510 is in electrical and mechanical contact with the conductor 80, and thereby forms an extension of the conductor 80, i.e. a conductor extension 510.

Because the first spacing element 465 is solid, it keeps a fixed distance between the first envelope element 510 and the first sensing electrode 440. The force exerted by the urging means, i.e. the foam element 466, on the first electrode assembly 600, does thus not change the distance between the first sensing electrode 440 and the first enveloping element 510. This enhances the accuracy of voltage sensing, when the first sensing electrode 440 is operated as a first capacitor electrode of a sensing capacitor for sensing a voltage of the conductor 80 of the conductor assembly 72. The sensing capacitor comprises the conductor 80 with the conductor extension 510 as the second electrode, and the spacing element 465 as a dielectric. Ceramic material is used for the spacing element 465, because ceramic material has particularly good insulating properties, and provides a small thermal expansion coefficient. This results in the distance between the conductor extension, i.e. the enveloping element 510, and the first sensing electrode 440 varying very little with temperature. This, in turn, reduces variations of the capacitance of the sensing capacitor with temperature, and thereby increases the accuracy of voltage sensing.

While the lower shell 20 contains the first electrode assembly 600 and the first foam element 466, the upper shell 10 contains, in symmetric arrangement, a corresponding second electrode assembly 601 and a corresponding second foam element 468. The second foam element 468 acts as an urging means for urging the second electrode assembly 601 towards the conductor 80 of the conductor assembly 72.

As in the previously described closures 1, 2, 3, 4, a conductive wire 180 electrically connects the first dividing capacitor, i.e. the sensing capacitor formed by the first sensing electrode 440, the conductor 80 with the conductor extension 510, and the insulating layer formed by the spacing layer 465, with a second dividing capacitor outside the closure 5. An end portion of the wire 180 is soldered to the first sensing electrode 440, so that it is mechanically and electrically connected to the first sensing electrode 440. The wire 180 is routed to an outside of the closure 5 and further to a PCB, on which the second dividing capacitor is arranged. The electrical potential of the first sensing electrode 440 of the sensing capacitor is thereby made available on the PCB and can be used to determine the voltage of the conductor 80. A second wire 181 is soldered to the second sensing electrode 441. It is routed to the PCB as well, whereby the electrical potential of the second sensing electrode 441 is also made available on the PCB and can be used to determine the voltage of the conductor 80 more precisely than if only the electrical potential of the first sensing electrode 440 were available. Alternatively, the wires 180, 181 might be electrically connected with each other, and the resulting potential be made available on the PCB. This may also provide a more accurate determination of the voltage of the conductor 80, than if only the potential of the first sensing electrode 440 were used.

Figure 8B:
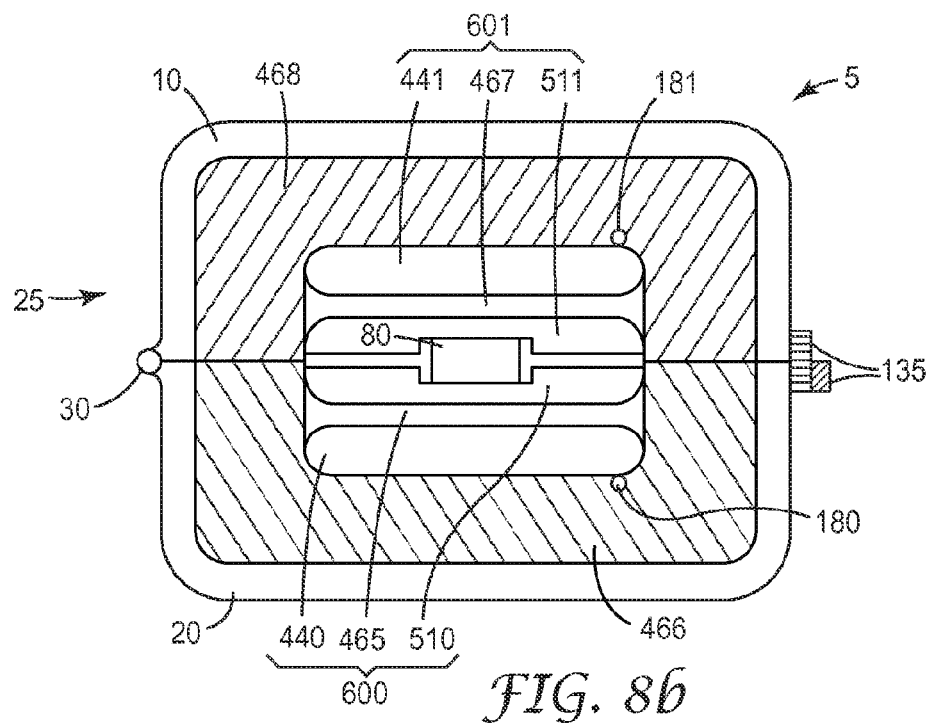

In FIG. 8b, the fifth closure 5 of FIG. 8a is shown with its housing 25 closed around the conductor assembly 72, i.e. around the bus bar. The upper shell 10 and the lower shell 20 are engaged with each other and the locking means 135 keeps them in engagement. The first foam element 466 and the second foam element 468 urge the first and the second electrode assemblies 600, 601, respectively, relative to the housing 25, towards the conductor assembly 72. The contact surface 550 of the first enveloping element 510 thereby establishes a mechanical surface contact with the outer surface 105 of the conductor assembly 72. Similarly, the contact surface 551 of the second enveloping element 511 establishes a mechanical surface contact with the outer surface 105 of the conductor assembly 72 on the opposite side (in cross section) of the conductor assembly 72. The enveloping elements 510, 511 are in electrical connection with the conductor 80 of the conductor assembly 72, and are therefore on the same electrical potential as the conductor 80. Because the enveloping elements 510, 511 are solid, a gap remains between these enveloping elements 510, 511. However, no strong electrical field exists in this gap between the enveloping elements 510, 511, because they are on the same potential, and consequently there is a low risk of a partial discharge occurring in the gap between the enveloping elements 510, 511. The use of an insulating grease for filling the gap is therefore not necessary. Any gaps between one of the enveloping elements 510, 511 and an adjacent foam element 466, 468 are so small that the risk of a partial discharge in those gaps is negligible.

The invention claimed is:

1. A closure for receiving a section of a conductor assembly, the conductor assembly comprising a conductor which defines axial directions and radial directions, the closure comprising a housing closable around the conductor assembly and a first electrode assembly, wherein the first electrode assembly comprises
   a) a movable portion which is movable relative to the housing, the movable portion comprising a contact surface for mechanically contacting the conductor assembly, and
   b) an electrically conductive first sensing electrode, operable as a first capacitor electrode of a sensing capacitor, wherein the sensing capacitor comprises the conductor, or a conductor extension, as a second capacitor electrode and an electrically insulating layer, arranged between the conductor and the first sensing electrode when the housing is closed around the conductor assembly, as a dielectric, wherein, the closure further comprises urging means, arranged between the housing and the first electrode assembly, the urging means being adapted to urge the movable portion of the first electrode assembly, relative to the housing, towards the conductor assembly for establishing a mechanical surface contact between the contact surface and an outer surface of the conductor assembly, when the housing is closed around the conductor assembly, wherein the conductor assembly comprises
   an insulating layer, arranged concentrically around the conductor, and operable as a dielectric of the sensing capacitor, and
   a conductive or semiconductive layer arranged on the insulating layer,
   a first axial section in which the outer surface of the conductor assembly is the outer surface of the insulating layer, and
   a second axial section in which the outer surface of the conductor assembly is the outer surface of the conductive or semiconductive layer, and
   wherein the closure comprises an electrically conductive first auxiliary electrode, electrically insulated from the first sensing electrode, and arranged inside the housing in axially spaced relation to the first sensing electrode, such that the first auxiliary electrode can mechanically and electrically contact the second axial section, when the housing is closed around the conductor assembly such that the contact surface of the first electrode assembly mechanically contacts the first axial section.

2. The closure according to claim 1, wherein the first sensing electrode comprises the movable portion and the contact surface of the first electrode assembly, so that the first sensing electrode is operable as a first capacitor electrode of a sensing capacitor for sensing a voltage of the conductor, which sensing capacitor comprises the conductor as a second capacitor electrode and an electrically insulating layer of the conductor assembly, arranged between the conductor and the first sensing electrode, as a dielectric.

3. The closure according to claim 1, wherein the first electrode assembly comprises an electrically insulating layer, arranged between the first sensing electrode and the contact surface, such that the insulating layer is operable as the dielectric of the sensing capacitor, when the housing is closed around the conductor assembly, wherein the insulating layer comprises the contact surface.

4. The closure according to claim 1, wherein at least a part of the movable portion of the first electrode assembly is conformable around the conductor assembly.

5. The closure according to claim 1, wherein the urging means is resilient or comprises a resilient material, a foam, a gel, a resilient mechanical element or a spring.

6. The closure according to claim 1, wherein the housing comprises two shells that can be engaged with each other for closing the housing around the conductor assembly.

7. The closure according to claim 1, wherein the insulating layer comprises a rigid portion for maintaining a fixed distance between the first sensing electrode and the conductor, when the housing is closed around the conductor assembly.

8. The closure according to claim 1, wherein the housing is adapted to be re-closable around the conductor assembly.

9. The closure according to claim 1, further comprising an electrically conductive shielding element, adapted to envelope the first sensing electrode and at least a part of the conductor, when the housing is closed around the conductor assembly, for providing electromagnetic shielding between the first sensing electrode and the outside of the closure.

10. The closure according to claim 1, comprising
   a) a second electrode assembly, which is arranged inside the housing, and which comprises an electrically conductive second sensing electrode, and
   b) an electrically conductive element for electrically connecting the second sensing electrode and the first sensing electrode with each other.

11. A conductor assembly, power cable or bus bar for a power network, comprising a power-carrying conductor and a closure according to claim 1.

12. A power network, comprising a conductor assembly, a power cable or a bus bar according to claim 11.

* * * * *